US006781194B2

(12) United States Patent
Baliga

(10) Patent No.: US 6,781,194 B2
(45) Date of Patent: Aug. 24, 2004

(54) VERTICAL POWER DEVICES HAVING RETROGRADED-DOPED TRANSITION REGIONS AND INSULATED TRENCH-BASED ELECTRODES THEREIN

(75) Inventor: Bantval Jayant Baliga, Raleigh, NC (US)

(73) Assignee: Silicon Semiconductor Corporation, Research Triangle Park, NC (US)

( * ) Notice: Subject to any disclaimer, the term of this patent is extended or adjusted under 35 U.S.C. 154(b) by 632 days.

(21) Appl. No.: 09/833,132

(22) Filed: Apr. 11, 2001

(65) Prior Publication Data

US 2002/0175351 A1 Nov. 28, 2002

(51) Int. Cl.$^7$ .............................................. H01L 29/76
(52) U.S. Cl. ...................... 257/327; 257/328; 257/329; 257/341; 257/345; 257/492; 257/493
(58) Field of Search ................................. 257/327–329, 257/341, 345, 491–493, 496

(56) References Cited

U.S. PATENT DOCUMENTS

| 4,376,286 A | 3/1983 | Lidow et al. .................. 357/23 |
| 4,378,286 A | 3/1983 | Eng et al. ....................... 357/23 |
| 4,419,811 A | 12/1983 | Rice .............................. 29/571 |
| 4,590,509 A | 5/1986 | Esser et al. ..................... 357/53 |
| 4,593,302 A | 6/1986 | Lidow et al. ............... 357/23.4 |
| 4,642,666 A | 2/1987 | Lidow et al. ............... 357/23.4 |
| 4,680,853 A | 7/1987 | Lidow et al. .................. 29/571 |
| 4,705,759 A | 11/1987 | Lidow et al. .................. 437/29 |
| 4,789,882 A | 12/1988 | Lidow ........................ 357/23.4 |
| 4,837,606 A | 6/1989 | Goodman et al. .......... 357/23.4 |
| 4,904,614 A | 2/1990 | Fisher et al. .................. 437/41 |
| 4,941,026 A | 7/1990 | Temple ....................... 357/23.4 |
| 4,959,699 A | 9/1990 | Lidow et al. ............... 357/23.7 |

(List continued on next page.)

FOREIGN PATENT DOCUMENTS

| DE | 195 34 154 A1 | 3/1997 |
| JP | 63-296282 | 2/1988 |
| JP | 93132077 | 5/1991 |
| WO | WO 99/56311 | 11/1999 |
| WO | WO 00/44031 | 7/2000 |

OTHER PUBLICATIONS

Merchant et al., "Realization of High Breakdown Voltage (<700 V) in This SOI Devices," Philips Laboratories, North American Philips Corporation 1991 IEEE, pp. 31–35.
Merchant et al., "Dependence of Breakdown Voltage on Drift Length and Buried Oxide Thickness in SOI RESURF LDMOS Transistors," 5$^{th}$ International Symposium on Power Semiconductor Devices and Ics, 1993 IEEE, pp. 124–128.
Sunkavalli et al., "Step Drift Doping Profile for High Voltage DI Lateral Power Devices," Proceedings 1995 IEEE International SOI Conference, Oct. 1995, pp. 139–140.
Yamaguchi, Ken, "Field–Dependent Mobility Model for Two–Dimensional Numerical Analysis of MOSFETs," IEEE Transactions on Electron Devices, vol. ED–26, No. 7, Jul. 1979, pp. 1068–1074.
International Search Report, PCT/US02/12775, Apr. 4, 2003.

Primary Examiner—Minh-Loan Tran
(74) Attorney, Agent, or Firm—Myers Bigel Sibley & Sajovec

(57) ABSTRACT

A power field effect transistor utilizes a retrograded-doped transition region to enhance forward on-state and reverse breakdown voltage characteristics. Highly doped shielding regions may also be provided that extend adjacent the transition region and contribute to depletion of the transition region during both forward on-state conduction and reverse blocking modes of operation. In a vertical embodiment, the transition region has a peak first conductivity type dopant concentration at a first depth relative to a surface on which gate electrodes are formed. A product of the peak dopant concentration and a width of the transition region at the first depth is preferably in a range between $1\times10^{12}$ cm$^{-2}$ and $7\times10^{12}$ cm$^{-2}$.

23 Claims, 22 Drawing Sheets

U.S. PATENT DOCUMENTS

| | | | |
|---|---|---|---|
| 4,974,059 A | 11/1990 | Kinzer | 357/23.4 |
| 4,975,751 A | 12/1990 | Beasom | 357/13 |
| 5,008,725 A | 4/1991 | Lidow et al. | 357/23.4 |
| 5,016,066 A | 5/1991 | Takahashi | 357/23.4 |
| 5,023,692 A | 6/1991 | Wodarczyk et al. | 357/43 |
| 5,079,608 A | 1/1992 | Wodarczyk et al. | 357/23.13 |
| 5,095,343 A | 3/1992 | Klodzinski et al. | 357/23.4 |
| 5,113,236 A | 5/1992 | Arnold et al. | 357/41 |
| 5,130,767 A | 7/1992 | Lidow et al. | 357/23.4 |
| 5,134,321 A | 7/1992 | Mehta | 307/571 |
| 5,191,396 A | 3/1993 | Lidow et al. | 257/339 |
| 5,213,986 A | 5/1993 | Pinker et al. | 437/20 |
| 5,216,807 A | 6/1993 | Yoshizawa et al. | 29/876 |
| 5,229,633 A | 7/1993 | Fisher et al. | 257/339 |
| 5,246,870 A | 9/1993 | Merchant | 437/21 |
| 5,283,201 A | 2/1994 | Tsang et al. | 437/31 |
| 5,300,448 A | 4/1994 | Merchant et al. | 437/41 |
| 5,338,961 A | 8/1994 | Lidow et al. | 257/342 |
| 5,350,932 A | 9/1994 | Malhi | 257/67 |
| 5,362,979 A | 11/1994 | Merchant | 257/340 |
| 5,391,908 A | 2/1995 | Walker et al. | 257/409 |
| 5,399,892 A | 3/1995 | Neilson et al. | 257/341 |
| 5,412,241 A | 5/1995 | Merchant | 257/409 |
| 5,445,978 A | 8/1995 | Yilmaz | 437/41 |
| 5,468,668 A | 11/1995 | Neilson et al. | 437/51 |
| 5,497,285 A | 3/1996 | Nadd | 381/103 |
| 5,545,908 A | 8/1996 | Tokura et al. | 257/341 |
| 5,578,508 A | 11/1996 | Baba et al. | 437/35 |
| 5,598,018 A | 1/1997 | Lidow et al. | 257/342 |
| 5,623,152 A | 4/1997 | Majumdar et al. | 257/330 |
| 5,640,034 A | 6/1997 | Malhi | 257/341 |
| 5,648,671 A | 7/1997 | Merchant | 257/347 |
| 5,661,314 A | 8/1997 | Merrill et al. | 257/144 |
| 5,672,526 A | 9/1997 | Kawamura | 437/41 R |
| 5,701,026 A | 12/1997 | Fujishima et al. | 257/510 |
| 5,710,451 A | 1/1998 | Merchant | 257/347 |
| 5,710,455 A | 1/1998 | Bhatnagar et al. | 257/472 |
| 5,731,604 A | 3/1998 | Kinzer | 257/153 |
| 5,742,087 A | 4/1998 | Lidow et al. | 257/342 |
| 5,766,966 A | 6/1998 | Ng | 437/40 |
| 5,767,547 A | 6/1998 | Merchant et al. | 257/347 |
| 5,844,275 A | 12/1998 | Kitamura et al. | 257/335 |
| 5,879,967 A | 3/1999 | Kim | 438/133 |
| 5,885,878 A | 3/1999 | Fujishima et al. | 438/302 |
| 5,918,137 A | 6/1999 | Ng et al. | 438/454 |
| 5,973,360 A | 10/1999 | Tihanyi | 257/330 |
| 5,998,833 A | 12/1999 | Baliga | 257/329 |
| 6,043,126 A | 3/2000 | Kinzer | 438/273 |
| 6,104,062 A | 8/2000 | Zeng | 257/341 |
| 6,114,726 A | 9/2000 | Barkhordarian | 257/341 |
| 6,127,746 A | 10/2000 | Clemente | 307/131 |
| 6,144,065 A | 11/2000 | Kinzer | 257/327 |
| 6,201,279 B1 | 3/2001 | Pfirsch | 257/333 |
| 6,441,408 B2 | 8/2002 | Porst et al. | 257/139 |
| 6,452,230 B1 | 9/2002 | Boden, Jr. | 257/341 |
| 6,459,142 B1 | 10/2002 | Tihanyi | 257/621 |
| 6,503,786 B2 | 1/2003 | Klodzinski | 438/212 |
| 6,521,962 B2 | 2/2003 | Evans | 257/409 |
| 6,525,383 B1 | 2/2003 | Stecher | 257/401 |
| 6,534,836 B1 | 3/2003 | Osanai | 257/401 |
| 6,541,820 B1 | 4/2003 | Bol | 257/341 |

VERTICAL POWER DEVICES HAVING RETROGRADED-DOPED TRANSITION REGIONS AND INSULATED TRENCH-BASED ELECTRODES THEREIN

FIELD OF THE INVENTION

The present invention relates to semiconductor switching devices, and more particularly to switching devices for power switching and power amplification applications and methods of forming same.

BACKGROUND OF THE INVENTION

Power MOSFETs have typically been developed for applications requiring power switching and power amplification. For power switching applications, the commercially available devices are typically DMOSFETs and UMOSFETs. In these devices, one main objective is obtaining a low specific on-resistance to reduce power losses. In a power MOSFET, the gate electrode provides turn-on and turn-off control upon the application of an appropriate gate bias. For example, turn-on in an N-type enhancement MOSFET occurs when a conductive N-type inversion-layer channel (also referred to as "channel region") is formed in the P-type base region in response to the application of a positive gate bias. The inversion-layer channel electrically connects the N-type source and drain regions and allows for majority carrier conduction therebetween.

The power MOSFET's gate electrode is separated from the base region by an intervening insulating layer, typically silicon dioxide. Because the gate is insulated from the base region, little if any gate current is required to maintain the MOSFET in a conductive state or to switch the MOSFET from an on-state to an off-state or vice-versa. The gate current is kept small during switching because the gate forms a capacitor with the MOSFET's base region. Thus, only charging and discharging current ("displacement current") is required during switching. Because of the high input impedance associated with the insulated-gate electrode, minimal current demands are placed on the gate and the gate drive circuitry can be easily implemented. Moreover, because current conduction in the MOSFET occurs through majority carder transport through an inversion-layer channel, the delay associated with the recombination and storage of excess minority carriers is not present. Accordingly, the switching speed of power MOSFETs can be made orders of magnitude faster than that of bipolar transistors. Unlike bipolar transistors, power MOSFETs can be designed to withstand high current densities and the application of high voltages for relatively long durations, without encountering the destructive failure mechanism known as "second breakdown". Power MOSFETs can also be easily paralleled, because the forward voltage drop across power MOSFETs increases with increasing temperature, thereby promoting an even current distribution in parallel connected devices.

DMOSFETs and UMOSFETs are more fully described in a textbook by B. J. Baliga entitled *Power Semiconductor Devices*, PWS Publishing Co. (ISBN 0-534-94098-6) (1995), the disclosure of which is hereby incorporated herein by reference. Chapter 7 of this textbook describes power MOSFETs at pages 335–425. Examples of silicon power MOSFETs including accumulation, inversion and extended trench FETs having trench gate electrodes extending into the N+ drain region are also disclosed in an article by T. Syau, P. Venkatraman and B. J. Baliga, entitled *Comparison of Ultralow Specific On-Resistance UMOSFET Structures: The ACCUFET, EXTFET, INVFET, and Conventional UMOSFETs*, IEEE Transactions on Electron Devices, Vol. 41, No. 5, May (1994). As described by Syau et al., specific on-resistances in the range of 100–250 $\mu\Omega cm^2$ were experimentally demonstrated for devices capable of supporting a maximum of 25 volts. However, the performance of these devices was limited by the fact that the forward blocking voltage must be supported across the gate oxide at the bottom of the trench. U.S. Pat. No. 4,680,853 to Lidow et al. also discloses a conventional power MOSFET that utilizes a highly doped N+ region 130 between adjacent P-base regions in order to reduce on-state resistance. For example, FIG. 22 of Lidow et al. discloses a high conductivity region 130 having a constant lateral density and a gradient from relatively high concentration to relatively low concentration beginning from the chip surface beneath the gate oxide and extending down into the body of the chip.

FIG. 1(*d*) from the aforementioned Syau et al. article discloses a conventional UMOSFET structure. In the blocking mode of operation, this UMOSFET supports most of the forward blocking voltage across the N-type drift layer, which must be doped at relatively low levels to obtain a high maximum blocking voltage capability, however low doping levels typically increase the on-state series resistance. Based on these competing design requirements of high blocking voltage and low on-state resistance, a fundamental figure of merit for power devices has been derived which relates specific on-resistance ($R_{on,sp}$) to the maximum blocking voltage (BV). As explained at page 373 of the aforementioned textbook to B. J. Baliga, the ideal specific on-resistance for an N-type silicon drift region is given by the following relation:

$$R_{on,sp}=5.93\times10^{-9}(BV)^{2.5} \quad (1)$$

Thus, for a device with 60 volt blocking capability, the ideal specific on-resistance is 170 $\mu\Omega cm^2$. However, because of the additional resistance contribution from the channel, reported specific on-resistances for UMOSFETs are typically much higher. For example, a UMOSFET having a specific on-resistance of 730 $\mu\Omega cm^2$ is disclosed in an article by H. Chang, entitled *Numerical and Experimental Comparison of 60V Vertical Double-Diffused MOSFETs and MOSFETs With A Trench-Gate Structure*, Solid-State Electronics, Vol. 32, No. 3, pp. 247–251, (1989). However, in this device a lower-than-ideal uniform doping concentration in the drift region was required to compensate for the high concentration of field lines near the bottom corner of the trench when blocking high forward voltages. U.S. Pat. Nos. 5,637,989 and 5,742,076 and U.S. application Ser. No. 08/906,916, filed Aug. 6, 1997, the disclosures of which are hereby incorporated herein by reference, also disclose popular power semiconductor devices having vertical current carrying capability.

In particular, U.S. Pat. No. 5,637,898 to Baliga discloses a preferred silicon field effect transistor which is commonly referred to as a graded-doped (GD) UMOSFET. As illustrated by FIG. 3 from the '898 patent, a unit cell 100 of an integrated power semiconductor device field effect transistor may have a width "$W_c$" of 1 $\mu m$ and comprise a highly doped drain layer 114 of first conductivity type (e.g., N+) substrate, a drift layer 112 of first conductivity type having a linearly graded doping concentration therein, a relatively thin base layer 116 of second conductivity type (e.g., P-type) and a highly doped source layer 118 of first conductivity type (e.g., N+). The drift layer 112 may be formed by epitaxially growing an N-type in-situ doped monocrystalline silicon layer having a thickness of 4 µm on an N-type drain layer 114 having a thickness of 100 µm and a doping concentration of greater than $1\times10^{18}$ cm$^{-3}$ (e.g. $1\times10^{19}$ cm$^{-3}$) therein. The drift layer 112 also has a linearly graded doping concentration therein with a maximum concentration of $3\times10^{17}$ cm$^{-3}$ at the N+/N junction with the drain layer 114, and a minimum concentration of $1\times10^{16}$ cm$^{-3}$ beginning at a distance 3 µm from the N+/N junction (i.e., at a depth of 1 µm) and continuing at a uniform level to the upper face. The base layer 116 may be formed by implanting a P-type dopant such as boron into the drift layer 112 at an energy of 100 kEV and at a dose level of $1\times10^{14}$ cm$^{-2}$. The P-type dopant may then be diffused to a depth of 0.5 µm into the drift layer 112. An N-type dopant such as arsenic may also be implanted at an energy of 50 kEV and at dose level of $1\times10^{15}$ cm$^{-2}$. The N-type and P-type dopants can then be diffused simultaneously to a depth of 0.5 µm and 1.0 µm, respectively, to form a composite semiconductor substrate containing the drain, drift, base and source layers.

A stripe-shaped trench having a pair of opposing sidewalls 120a which extend in a third dimension (not shown) and a bottom 120b is then formed in the substrate. For a unit cell 100 having a width $W_c$ of 1 µm, the trench is preferably formed to have a width "$W_t$" of 0.5 µm at the end of processing. An insulated gate electrode, comprising a gate insulating region 124 and an electrically conductive gate 126 (e.g., polysilicon), is then formed in the trench. The portion of the gate insulating region 124 extending adjacent the trench bottom 120b and the drift layer 112 may have a thickness "$T_1$" of about 2000 Å to inhibit the occurrence of high electric fields at the bottom of the trench and to provide a substantially the gate insulating region 124 extending opposite the base layer 116 and the source layer 118 may have a thickness "$T_2$" of about 500 Å to maintain the threshold voltage of the device at about 2–3 volts. Simulations of the unit cell 100 at a gate bias of 15 Volts confirm that a vertical silicon field effect transistor having a maximum blocking voltage capability of 60 Volts and a specific on-resistance ($RP_{sp,on}$) of 40 µΩcm$^2$, which is four (4) times smaller than the ideal specific on-resistance of 170 µΩcm$^2$ for a 60 volt power UMOSFET, can be achieved. Notwithstanding these excellent characteristics, the transistor of FIG. 3 of the '898 patent may suffer from a relatively low high-frequency figure-of-merit (HFOM) if the overall gate-to-drain capacitance ($C_{GD}$) is too large. Improper edge termination of the MOSFET may also prevent the maximum blocking voltage from being achieved. Additional UMOSFETs having graded drift regions and trench-based source electrodes are also disclosed in U.S. Pat. No. 5,998,833 to Baliga, the disclosure of which is hereby incorporated herein by reference.

Power MOSFETs may also be used in power amplification applications (e.g., audio or rf). In these applications the linearity of the transfer characteristic (e.g., $I_d$ v. $V_g$) becomes very important in order to minimize signal distortion. Commercially available devices that are used in these power amplification applications are typically the LDMOS and gallium arsenide MESFETs. However, as described below, power MOSFETs including LDMOS transistors, may have non-linear characteristics that can lead to signal distortion. The physics of current saturation in power MOSFETs is described in a textbook by S. M. Sze entitled "Physics of Semiconductor Devices, Section 8.2.2, pages 438–451 (1981). As described in this textbook, the MOSFET typically works in one of two modes. At low drain voltages (when compared with the gate voltage), the MOSFET operates in a linear mode where the relationship between $I_d$ and $V_g$ is substantially linear. Here, the transconductance ($g_m$) is also independent of $V_g$:

$$g_m=(Z/L)u_{ns}C_{ox}V_d \quad (2)$$

where Z and L are the channel width and length, respectively, $u_{ns}$ is the channel mobility, $C_{ox}$ is the specific capacitance of the gate oxide, and $V_d$ is the drain voltage. However, once the drain voltage increases and becomes comparable to the gate voltage ($V_g$), the MOSFET operates in the saturation mode as a result of channel pinch-off. When this occurs, the expression for transconductance can be expressed as:

$$g_m=(Z/L)u_{ns}C_{ox}(V_g-V_{th}) \quad (3)$$

where $V_g$ represents the gate voltage and $V_{th}$ represents the threshold voltage of the MOSFET. Thus, as illustrated by equation (3), during saturation operation, the transconductance increases with increasing gate bias. This makes the relationship between the drain current (on the output side) and the gate voltage (on the input side) non-linear because the drain current increases as the square of the gate voltage. This non-linearity can lead to signal distortion in power amplifiers. In addition, once the voltage drop along the channel becomes large enough to produce a longitudinal electric field of more than about $1\times10^4$ V/cm while remaining below the gate voltage, the electrons in the channel move with reduced differential mobility because of carrier velocity saturation.

Thus, notwithstanding attempts to develop power MOSFETs for power switching and power amplification applications, there continues to be a need to develop power MOSFETs that can support high voltages and have improved electrical characteristics, including highly linear transfer characteristics when supporting high voltages.

SUMMARY OF THE INVENTION

Vertical power devices according to embodiments of the present invention utilize retrograded-doped transition regions to enhance forward on-state and reverse breakdown voltage characteristics. Highly doped shielding regions may also be provided that extend adjacent the transition regions and contribute to depletion of the transition regions during both forward on-state conduction and reverse blocking modes of operation.

A vertical power device (e.g., MOSFET) according to a first embodiment of the invention comprises a semiconductor substrate having first and second trenches and a drift region of first conductivity type (e.g., N-type) therein that extends into a mesa defined by and between the first and second trenches. The drift region is preferably nonuniformly doped and may have a retrograded doping profile relative to an upper surface of the substrate in which the first and second trenches are formed. In particular, the substrate may comprise a highly doped drain region of first conductivity type and a drift region that extends between the drain region and the upper surface. The doping profile in the drift region may decrease monotonically from a nonrectifying junction with the drain region to the upper surface of the substrate and an upper portion of the drift region may be uniformly doped at a relatively low level (e.g., $1\times10^{16}$ cm$^{-3}$). First and second insulated electrodes may also be provided in the first and second trenches. These first and second insulated electrodes may constitute trench-based source electrodes in a three-terminal device.

First and second base regions of second conductivity type (e.g., P-type) are also provided in the mesa. These base regions preferably extend adjacent sidewalls of the first and second trenches, respectively. First and second highly doped source regions of first conductivity type are also provided in the first and second base regions, respectively. An insulated gate electrode is provided that extends on the mesa. The insulated gate electrode is patterned so that the upper surface preferably defines an interface between the insulated gate electrode and the first and second base regions. Inversion-layer channels are formed within the first and second base regions during forward on-state conduction, by applying a gate bias of sufficient magnitude to the insulated gate electrode.

A transition region of first conductivity type is also provided in the mesa. This transition region preferably extends between the first and second base regions and extends to the interface with the insulated gate electrode. The transition region may also form a non-rectifying junction with the drift region and has a vertically retrograded first conductivity type doping profile relative to the upper surface. This doping profile has a peak doping concentration at a first depth relative to the upper surface, which may extend in a range from about 0.2 to 0.5 microns relative to the upper surface. Between the first depth and the upper surface, the doping profile is preferably monotonically decreasing in a direction towards the upper surface. A magnitude of a portion of a slope of this monotonically decreasing profile is preferably greater that $3 \times 10^{21}$ cm$^{-4}$. The establishment of a "buried" peak at the first depth may be achieved by performing a single implant step at respective dose and energy levels or by performing multiple implant steps at respective dose levels and different energy levels. The peak dopant concentration in the transition region is preferably greater than at least about two (2) times the transition region dopant concentration at the upper surface. More preferably, the peak dopant concentration in the transition region is greater than about ten (10) times the transition region dopant concentration at the upper surface.

According to preferred aspects of power devices of the first embodiment, a product of the peak first conductivity type dopant concentration in the transition region (at the first depth) and a width of the transition region at the first depth is in a range between $1 \times 10^{12}$ cm$^{-2}$ and $7 \times 10^{12}$ cm$^{-2}$ and, more preferably, in a range between about $3.5 \times 10^{12}$ cm$^{-2}$ and about $6.5 \times 10^{12}$ cm$^{-2}$. Depending on unit cell design within an integrated multi-celled device, the product of the peak first conductivity type dopant concentration in the transition region and a width of the non-rectifying junction between the transition region and the drift region may also be in a range between $1 \times 10^{12}$ cm$^{-2}$ and $7 \times 10^{12}$ cm$^{-2}$. A product of the peak first conductivity type dopant concentration in the transition region, a width of the transition region at the first depth and a width of the mesa may also be set at a level less than $2 \times 10^{15}$ cm$^{-1}$. To achieve sufficient charge coupling in the drift region mesa, a product of the drift region mesa width and quantity of first conductivity type charge in a portion of the drift region mesa extending below the transition region is preferably in a range between $2 \times 10^{9}$ cm$^{-1}$ and $2 \times 10^{10}$ cm$^{-1}$.

According to further aspects of the first embodiment, enhanced forward on-state and reverse blocking characteristics can be achieved by including highly doped shielding regions of second conductivity type that extend in the mesa and on opposite sides of the transition region. In particular, a first shielding region of second conductivity type is provided that extends between the first base region and the drift region and is more highly doped than the first base region. Similarly, a second shielding region of second conductivity type is provided that extends between the second base region and the drift region and is more highly doped than the second base region. To provide depletion during forward on-state and reverse blocking modes of operation, the first and second shielding regions form respective P-N rectifying junctions with the transition region. High breakdown voltage capability may also be achieved by establishing a product of the peak first conductivity type dopant concentration in the transition region and a width between the first and second shielding regions in a range between $1 \times 10^{12}$ cm$^{-2}$ and $7 \times 10^{12}$ cm$^{-2}$.

Integrated vertical power devices according to a second embodiment of the invention preferably comprise active unit cells that provide forward on-state current and dummy cells that remove heat from the active cells during forward on-state conduction and support equivalent maximum reverse blocking voltages. According to the second embodiment, each integrated unit cell may comprise an active unit cell and one or more dummy unit cells. In addition to the first and second trenches, a third trench may be provided in the semiconductor substrate. The first and second trenches define an active mesa, in which an active unit cell is provided, and the second and third trenches define a dummy mesa therebetween in which a dummy unit cell is provided. A dummy base region of second conductivity type is provided in the dummy mesa preferably along with a dummy shielding region. The dummy base and shielding regions preferably extend across the dummy mesa and may be electrically connected to the first and second source regions within the active unit cell. In the event one or more dummy unit cells is provided, uniform reverse blocking voltage characteristics can be achieved by making the width of the mesa, in which the active unit cell is provided, equal to a width of the respective dummy mesa in which each of the dummy unit cells is provided. Alternatively, and in place of the third dummy base region, a field plate insulating layer may be provided on an upper surface of the dummy mesa and a third insulated electrode may be provided in the third trench. The source electrode may extend on the field plate insulating layer and is electrically connected to the first, second and third insulated electrodes within the trenches. In the event a field plate insulating layer is provided on the dummy mesa instead of using a dummy base region, the spacing between the first and second trenches need not necessarily equal the spacing between the second and third trenches in order to support maximum blocking voltages.

Additional embodiments of the present invention also include methods of forming vertical power devices. These methods preferably include implanting transition region dopants of first conductivity type at a first dose level and first energy level into a surface of a semiconductor substrate having a drift region of first conductivity type therein that extends adjacent the surface. An insulated gate electrode may then be formed on the surface. The insulated gate electrode is preferably patterned so that it extends opposite the implanted transition region dopants. Shielding region dopants of second conductivity type are then implanted at a second dose level and second energy level into the surface. This implant step is preferably performed in a self-aligned manner with respect to the gate electrode, by using the gate electrode as an implant mask. Base region dopants of second conductivity type are also implanted at a third dose level and third energy level into the surface, using the gate electrode as an implant mask Accordingly, the base and shielding region dopants are self-aligned to each other.

A thermal treatment step is then performed to drive the implanted transition, shielding and base region dopants into the substrate and define a transition region, first and second shielding regions on opposite sides of the transition region and first and second base regions on opposite sides of the transition region. The transition region extends into the drift region and has a vertically retrograded first conductivity type doping profile therein relative to the surface. This retrograded profile is achieved by establishing a buried peak dopant concentration sufficiently below the surface. The first and second shielding regions form respective P-N rectifying junctions with the transition region and the first and second base regions also form respective P-N rectifying junctions with the transition region. The dose and implant energies associated with the base and shielding region dopants are also selected so that the shielding regions are more highly doped relative to the base regions and extend deeper into the substrate.

According to a preferred aspect of this embodiment, the first dose and energy levels and a duration of the thermal treatment step are of sufficient magnitude that a product of a peak first conductivity type dopant concentration in the transition region and a width of the transition region, as measured between the first and second shielding regions, is in a range between $1 \times 10^{12}$ cm$^{-2}$ and $7 \times 10^{12}$ cm$^{-2}$. The first and second energy levels may also be set to cause a depth of a peak second conductivity type dopant concentration in the shielding region to be within 10% of a depth of a peak first conductivity type dopant concentration in the transition region, when the depths of the peaks are measured relative to the surface.

The step of implanting shielding region dopants is also preferably preceded by the step of forming trenches in the semiconductor substrate and lining the trenches with trench insulating layers. Conductive regions are also formed on the trench insulating layers. These trench related steps may be performed before the step of implanting the transition region dopants. In this case, the transition region dopants are preferably implanted into the conductive regions within the trenches and into mesas that are defined by the trenches. According to still further preferred aspects of this embodiment, steps are also performed to increase maximum on-state current density within the power device by improving the configuration of the source contact. In particular, the source contact is formed on a sidewall of the trenches by etching back the trench insulating layers to expose the source, base and shielding regions and then forming a source contact that ohmically contacts the conductive regions and also contacts the source, base and shielding regions at the sidewall of each trench.

DESCRIPTION OF PREFERRED EMBODIMENTS

Figure 1:
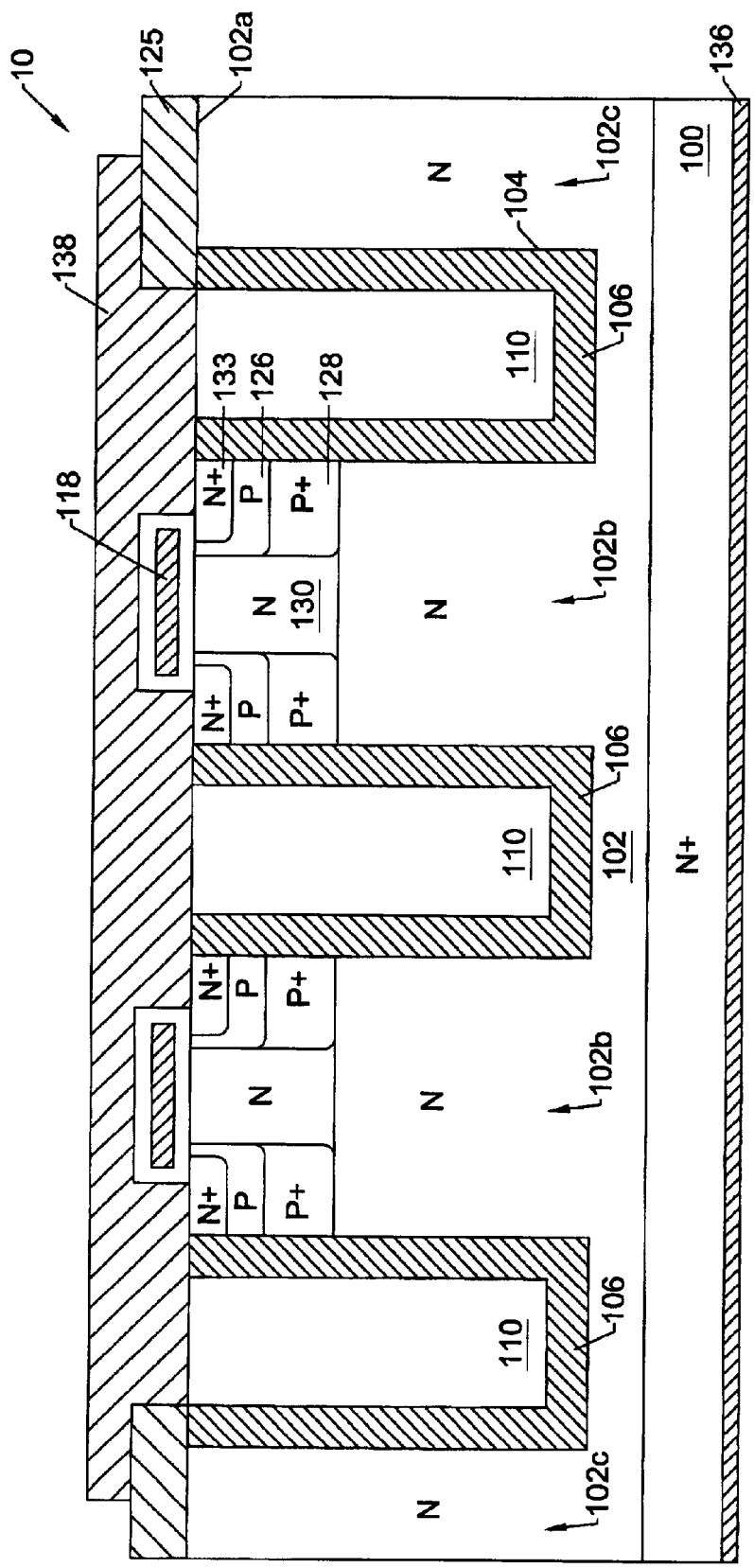
FIG. 1 is a cross-sectional view of a vertical power device according to a first embodiment of the present invention.

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. It will also be understood that when a layer is referred to as being "on" another layer or substrate, it can be directly on the other layer or substrate, or intervening layers may also be present. Moreover, the terms "first conductivity type" and "second conductivity type" refer to opposite conductivity types such as N or P-type, however, each embodiment described and illustrated herein includes its complementary embodiment as well. Like numbers refer to like elements throughout.

Referring now to FIG. 1, an integrated vertical power device 10 according to a first embodiment of the present invention includes a plurality of active vertical power device unit cells located side-by-side in a semiconductor substrate. As illustrated, the power device 10 comprises a highly doped drain region 100 of first conductivity type (shown as N+) and a drift region 102 of first conductivity type that forms a non-rectifying junction with the drain region 100. A drain electrode 136 is also provided in ohmic contact with the drain region 100. The drain region 100 may have a thickness in a range between about 10 microns and about 500 microns. The drift region 102 is preferably nonuniformly doped. In particular, the drift region 102 preferably has a graded doping profile which decreases monotonically in a direction extending from the non-rectifying junction to a first surface 102a of the drift region 102. This graded doping profile may be a linearly graded doping profile that decreases from a preferred maximum drift region dopant concentration in a range between about $1 \times 10^{17}$ and about $2.5 \times 10^{17}$ cm$^{-3}$ to a minimum dopant concentration. Accordingly, if the drain region 100 is doped at a level of about $1 \times 10^{19}$ cm$^{-3}$ or greater, then the non-rectifying junction will be an abrupt non-rectifying junction. An upper portion of the drift region 102 may be uniformly doped at a level of about $1 \times 10^{16}$ cm$^{-3}$ and the uniformly doped upper portion of the drift region 102 may have a thickness in a range between about 0.5 and about 1.0 μm.

A plurality of trenches 104 may be formed in the drift region 102. If trenches are provided, the trenches 104 are preferably formed side-by-side in the drift region 102 as parallel stripe-shaped trenches, however, other less preferred trench shapes (e.g., ring-shaped) may also be used. As described herein, regions will be defined as separate regions if they appear as such when viewed in transverse cross-section. Each pair of trenches preferably defines a drift region mesa 102b therebetween, as illustrated. An electrically insulating layer 106 is also provided on the sidewalls and bottoms of the trenches 104. The "trench" insulating layer 106 may have a thickness of about 3000 Å, however, the thickness may vary depending, among other things, on the rating of the power device 10. The electrically insulating layer 106 may comprise silicon dioxide or another conventional dielectric material. Each of the trenches 104 is preferably filled with a conductive region 110 that is electrically insulated from the drift region 102 by a respective electrically insulating layer 106. The conductive regions 110 may constitute trench-based electrodes that are electrically connected together by a source electrode 138. This source contact/electrode 138 may extend on the first surface 102a of the drift region 102, as illustrated.

Figure 8A:
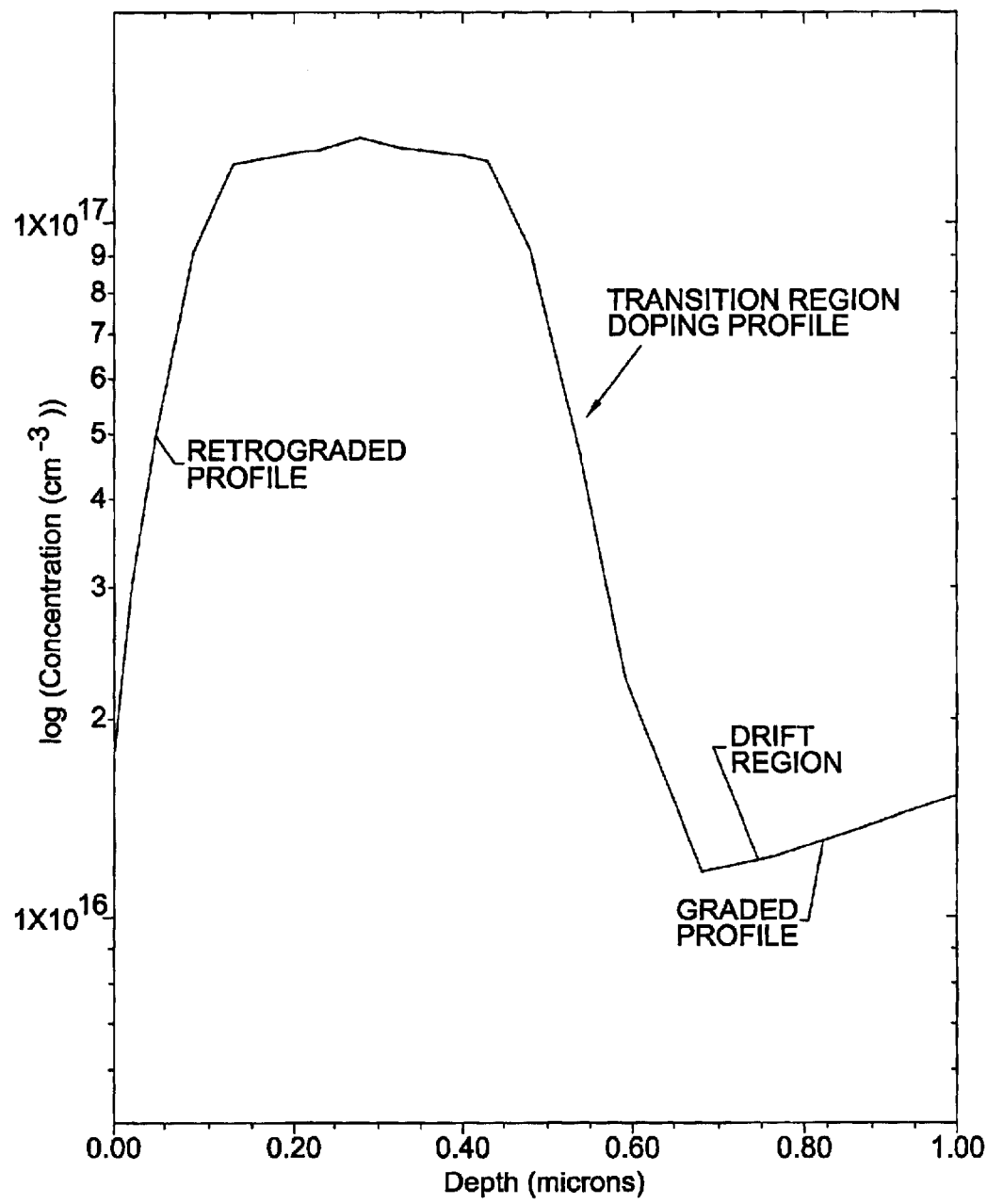
FIG. 8A is a graphical illustration of a preferred vertically retrograded doping profile across the transition region of the embodiment of FIG. 1, obtained by performing multiple implants of transition region dopants at respective different energies.

Upper uniformly doped portions of the drift region mesas 102b preferably comprise respective transition regions 130 of first conductivity type. The transition regions 130 form respective non-rectifying junctions with the drift region 102 and, depending on thickness, may form respective non-rectifying junctions with the uniformly doped upper portions of the drift region 102 or the graded doped portions of the drift region 102. For example, the uniformly doped upper portions of the drift region 102 may have a thickness of about 1.0 μm relative to the first surface 102a and the transition regions 130 may have thicknesses of about 0.7 μm relative to the first surface 102a. Moreover, according to a preferred aspect of the present invention, each transition region 130 has a first conductivity type doping profile therein that is vertically retrograded relative to the first surface 102a. In particular, a peak first conductivity type dopant concentration at a first depth in the transition region is at least two (2) times greater than a value of the retrograded first conductivity type doping profile at the first surface 102a. More preferably, the peak first conductivity type dopant concentration in the transition region is at least about ten (10) times greater than the value of the first conductivity type dopant concentration at the first surface. According to another preferred aspect, a slope of at least a portion of the retrograded first conductivity type doping profile is greater than about $3 \times 10^{21}$ cm$^{-4}$. The doping profile in the transition region 130 also includes a high-to-low graded profile in a direction extending downward from the peak to the non-rectifying junction between the transition region 130 and the drift region 102. A desired doping profile may be achieved by performing a single transition region implant step at relatively high energy and dose or performing multiple implant steps. For example, as illustrated by FIG. 8A, a relatively wide peak in the transition region doping profile may be achieved by performing three implant steps at respective energies (and same or similar dose levels) to achieve first, second and third implant depths of about 0.15, 0.3 and 0.45 microns, using a dopant having a characteristic diffusion length of about 0.1 microns.

Gate electrodes 118 are provided on the first surface 102a, as illustrated. These gate electrodes 118 may be stripe-shaped and may extend parallel to the trench-based electrodes 110. As illustrated, the gate electrodes 118 preferably constitute insulated gate electrodes (e.g., MOS gate electrodes). The vertical power device 10 also comprises highly doped shielding regions 128 of second conductivity type (shown as P+) that are formed at spaced locations in the drift region mesas 102b. These shielding regions 128 are preferably self-aligned to the gate electrodes 118. Each of the shielding regions 128 preferably forms a P-N rectifying junction with a respective side of the transition region 130 and with a respective drift region mesa 102b (or tail of the transition region 130). According to a preferred aspect of the present invention, the peak second conductivity type dopant concentration in each shielding region 128 is formed at about the same depth (relative to the first surface 102a) as the peak first conductivity type dopant concentration in a respective transition region 130. Base regions 126 of second conductivity type (shown as P) are also formed in respective drift region mesas 102b. Each base region 126 is preferably self-aligned to a respective gate electrode 118. Highly doped source regions 133 of first conductivity type (shown as N+) are also formed in respective base regions 126, as illustrated. The spacing along the first surface 102a between a source region 133 and a respective edge of the transition region 130 defines the channel length of the power device 10. These source regions 133 ohmically contact the source electrode 138. Edge termination may also be provided by extending the source electrode 138 over peripheral drift region extensions 102c and by electrically isolating the source electrode 138 from the peripheral drift region extensions 102c by a field plate insulating region 125.

The combination within each drift region mesa 102b of (i) a pair of spaced-apart shielding regions 128 and (ii) a preferred transition region 130 that extends between the shielding regions 128 and has a vertically retrograded doping profile, can enhance the breakdown voltage characteristics of each active unit cell in the multi-celled power device 10. In particular, the shielding regions 128 can operate to "shield" the respective base regions 126 by significantly suppressing P-base reach-through effects when the power device 10 is blocking reverse voltages and causing reverse current to flow through the shielding regions 128 instead of the regions 126. This suppression of P-base reach-through enables a reduction in the channel length of the device 10. Moreover, the preferred retrograded doping profile in the transition region 130 enables complete or full depletion of the transition region 130 when the power device 10 is blocking maximum reverse voltages and the drift region mesa 102b is supporting the reverse voltage.

Full depletion of the transition region 130 may also occur during forward on-state conduction. In particular, full depletion during forward operation preferably occurs before the voltage In the channel (at the end adjacent the transition region 130) equals the gate voltage on the insulated gate electrode 118. As used herein, the reference to the transition region being "fully depleted" should be interpreted to mean that the transition region is at least sufficiently depleted to provide a JFET-style pinch-off of a forward on-state current path that extends vertically through the transition region 130. To achieve full depletion, the relatively highly doped shielding regions 128 of second conductivity (e.g., P+) are provided in close proximity and on opposite sides of the transition region 130. As the voltage in the channel increases during forward on-state conduction, the transition region 130 becomes more and more depleted until a JFET-style pinch-off occurs within the transition region 130. This JFET-style pinch-off in the transition region 130 can be designed to occur before the voltage at the drain-side of the channel ($V_{cd}$) equals the gate voltage (i.e., $V_{cd} \leq V_{gs}$). For example, the MOSFET may be designed so that the transition region 130 becomes fully depleted when $0.1 \leq V_{cd} \leq 30.5$ Volts and $V_{gs} = 4.0$ Volts. Use of the preferred transition region 130 enables the field effect transistor within the power device 10 to operate in a linear mode of operation during forward on-state conduction while a drain region of the transistor simultaneously operates in a velocity saturation mode of operation. Other power devices that exhibit similar modes of operation are described in U.S. application Ser. No. 09/602,414, filed Jun. 23, 2000, entitled "MOSFET Devices Having Linear Transfer Characteristics When Operating in Velocity Saturation Mode and Methods of Forming and Operating Same", assigned to the present assignee, the disclosure of which is hereby incorporated herein by reference.

Figure 8B:
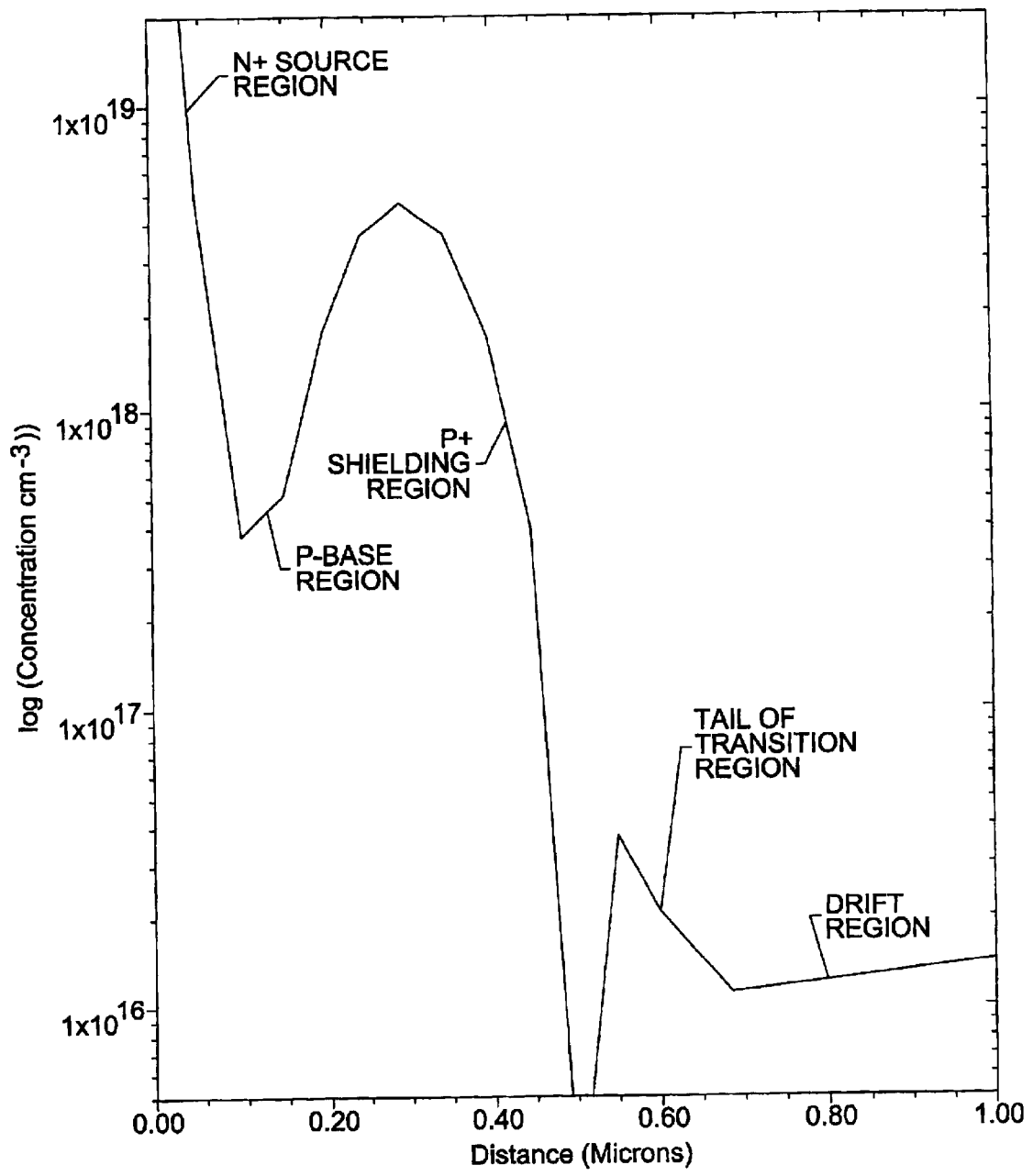
FIG. 8B is a graphical illustration of a preferred vertical doping profile across the source, base and shielding regions of the embodiment of FIG. 1.

Simulations of the device of FIG. 1 were also performed for a unit cell having a trench depth of 4.7 microns, a trench width of 1.1 microns and a mesa width of 1.9 microns. A sidewall oxide thickness of 3000 Å was also used. The drift region had a thickness of 6 microns and the uniformly doped upper portion of the drift region had a thickness of 0.5 microns. The concentration of first conductivity type dopants in the uniformly doped A upper portion of the drift region was set at $1 \times 10^{16}$ cm$^{-3}$ and the drain region had a phosphorus doping concentration of $5 \times 10^{19}$ cm$^{-3}$. The gate oxide thickness was set at 250 Å and a total gate length (across the mesa) of 0.9 microns was used. The widths of the shielding, base and source regions (relative to the sidewalls) were 0.65, 0.65 and 0.45 microns, respectively, and the channel length was 0.2 microns. The width of the transition region (at the depth of the peak concentration in the transition region) was set at 0.6 microns. The depths of the source, base, shielding and transition regions and their peak dopant concentrations can be obtained from the following Table 1 and FIGS. 8A–8B, where Peak $N_d$ and Peak $N_a$ are the peak donor and acceptor concentrations.

TABLE 1

| Region | Implant Energy (KeV) | Implant Dose (cm$^{-2}$) | Dopant | Peak $N_{d,a}$ cm$^{-3}$ |
|---|---|---|---|---|
| N+ source | 40–50 | $1–5 \times 10^{15}$ | P, As | $1 \times 10^{20}$ |
| P-base | 40–50 | $1–5 \times 10^{13}$ | B | $2 \times 10^{18}$ (surface); $4 \times 10^{17}$ (channel max) |
| P+ shield | 100 | $1–5 \times 10^{14}$ | B | $5 \times 10^{18}$ |
| N-transition | 200 | $1–10 \times 10^{12}$ | P | $1.3 \times 10^{17}$ |

Based on the above characteristics and including variations of the peak dopant concentration in the transition region (Peak$_{TR}$) and width of the transition region (W$_{TR}$), the following simulated breakdown voltages of Tables 2 and 3 were obtained. Medici™ simulation software, distributed by Avant!™ Corporation, was used to perform the device simulations.

TABLE 2

| W$_{TR}$(μm) | (Peak$_{TR}$)(cm$^{-3}$) | BV (Volts) | Q(#/cm$^2$) |
|---|---|---|---|
| 0.5 | $0.4 \times 10^{17}$ | 80 | $0.2 \times 10^{13}$ |
| 0.5 | $0.7 \times 10^{17}$ | 80 | $0.35 \times 10^{13}$ |
| 0.5 | $1.2 \times 10^{17}$ | 79 | $0.6 \times 10^{13}$ |
| 0.5 | $1.3 \times 10^{17}$ | 78 | $0.65 \times 10^{13}$ |
| 0.5 | $1.4 \times 10^{17}$ | 62 | $0.7 \times 10^{13}$ |
| 0.5 | $1.6 \times 10^{17}$ | 35 | $0.8 \times 10^{13}$ |
| 0.5 | $1.9 \times 10^{17}$ | 20 | $0.95 \times 10^{13}$ |
| 0.5 | $2.5 \times 10^{17}$ | 9 | $1.25 \times 10^{13}$ |

TABLE 3

| W$_{TR}$(μm) | (Peak$_{TR}$)(cm$^{-3}$) | BV (Volts) | Q(#/cm$^2$) |
|---|---|---|---|
| 0.3 | $1.4 \times 10^{17}$ | 80 | $0.42 \times 10^{13}$ |
| 0.4 | $1.4 \times 10^{17}$ | 80 | $0.56 \times 10^{13}$ |
| 0.5 | $1.4 \times 10^{17}$ | 62 | $0.7 \times 10^{13}$ |
| 0.6 | $1.4 \times 10^{17}$ | 37 | $0.84 \times 10^{13}$ |
| 0.7 | $1.4 \times 10^{17}$ | 24 | $0.98 \times 10^{13}$ |

As determined by the inventor herein and illustrated by the simulation results of Tables 2 and 3, power devices having high breakdown voltages can be provided by establishing a product of the peak first conductivity type dopant concentration in the transition region (at the first depth) and a width of the transition region at the first depth in a preferred range that is between about $1 \times 10^{12}$ cm$^{-2}$ and about $7 \times 10^{12}$ cm$^{-2}$ and, more preferably, in a range between about $3.5 \times 10^{12}$ cm$^{-2}$ and about $6.5 \times 10^{12}$ cm$^{-2}$. This narrower more preferred range can result in devices having high breakdown voltage and excellent on-state resistance characteristics. Depending on unit cell design within an integrated multi-celled device, the product of the peak first conductivity type dopant concentration in the transition region and a width of the non-rectifying junction between the transition region and the drift region may also be in a range between about $1 \times 10^{12}$ cm$^{-2}$ and about $7 \times 10^{12}$ cm$^{-2}$. A product of the peak first conductivity type dopant concentration in the transition region, a width of the transition region at the first depth and a width of the mesa may also be set at a level less than about $2 \times 10^{15}$ cm$^{-1}$. To achieve sufficient charge coupling in the drift region mesa, a product of the drift region mesa width and quantity of first conductivity type charge in a portion of the drift region mesa extending below the transition region is preferably in a range between about $2 \times 10^9$ cm$^{-1}$ and about $2 \times 10^{10}$ cm$^{-1}$.

Figure 2:
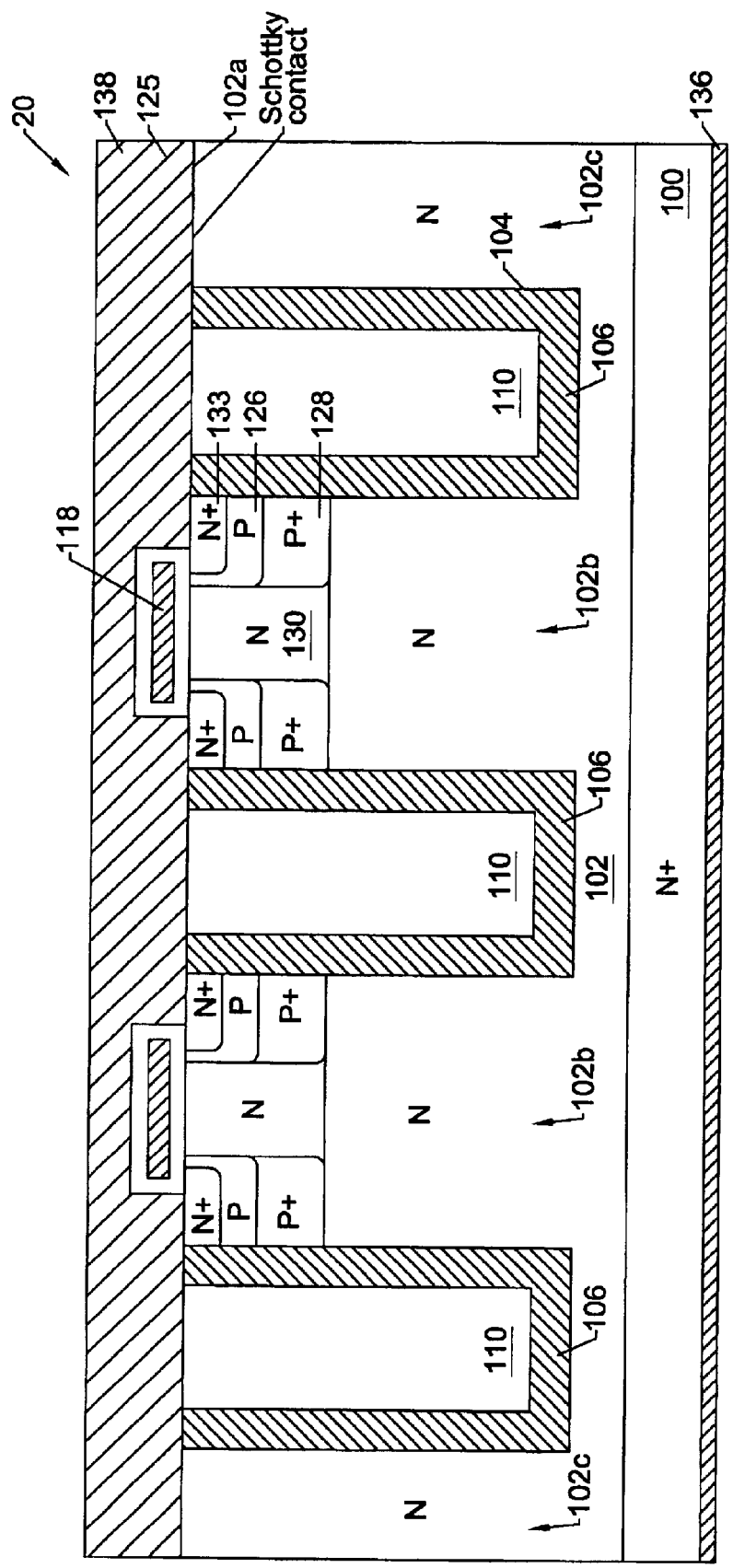
FIG. 2 is a cross-sectional view of a vertical power device according to a second embodiment of the present invention.
Figure 3:
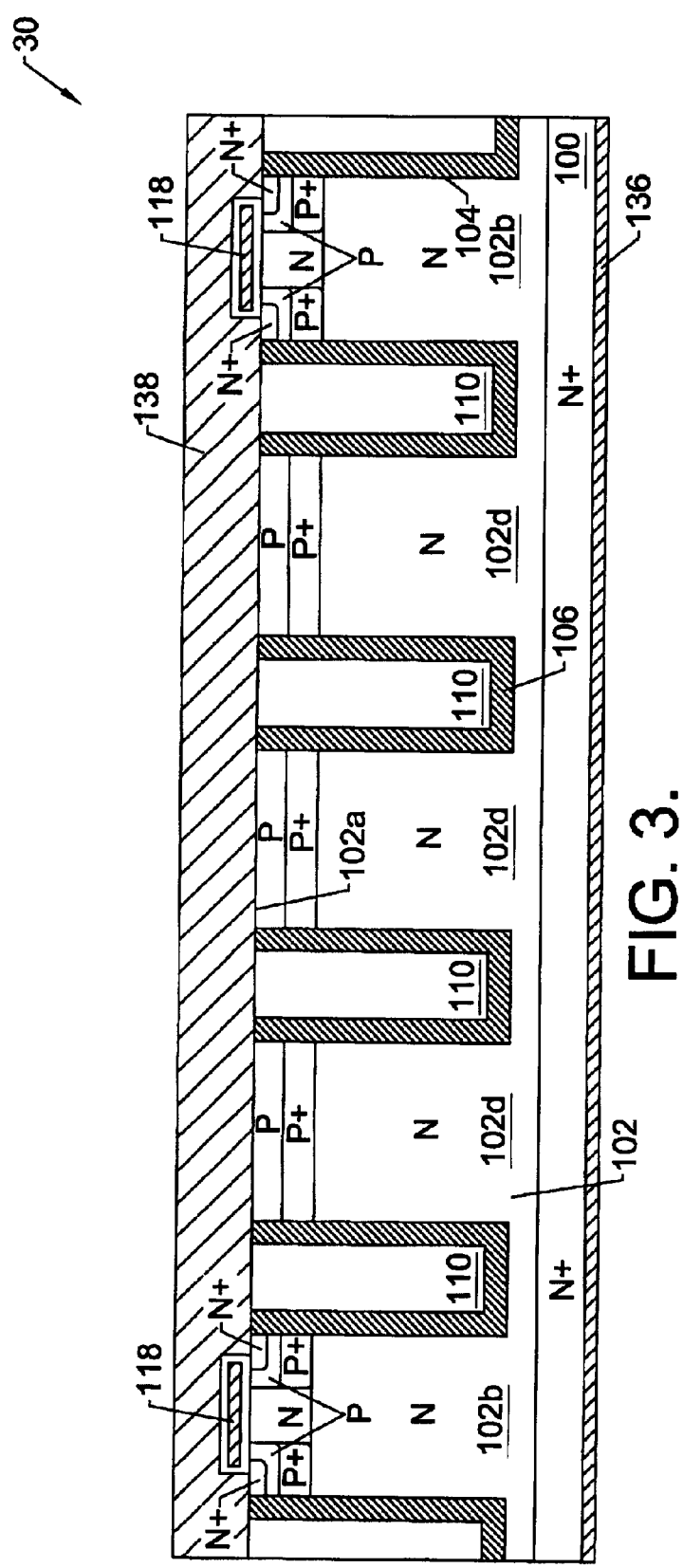
FIG. 3 is a cross-sectional view of a vertical power device according to a third embodiment of the present invention.

Referring now to FIGS. 2–7, additional embodiments of power devices according to the present invention include the multi-celled power device 20 of FIG. 2. This device 20 is similar to the device 10 of FIG. 1, however, antiparallel diodes are provided by Schottky rectifying contacts that extend between the source electrode 138 and the drift region extensions 102c. The power device 30 of FIG. 3 is also similar to the power device 20 of FIG. 2, however, a plurality of dummy unit cells are provided in dummy drift region mesas 102d. Dummy shielding regions (shown as P+) and dummy base regions (shown as P) are also provided in the dummy drift region mesas 102d. As illustrated, the dummy base regions electrically contact the source electrode 138. The dummy base regions and dummy shielding region can be formed at the same time as the base and shielding regions within the active unit cells. Depending on the thermal ratings of a multi-celled power device, one or more dummy unit cells may be provided to facilitate heat removal from each active unit cell.

Figure 4:
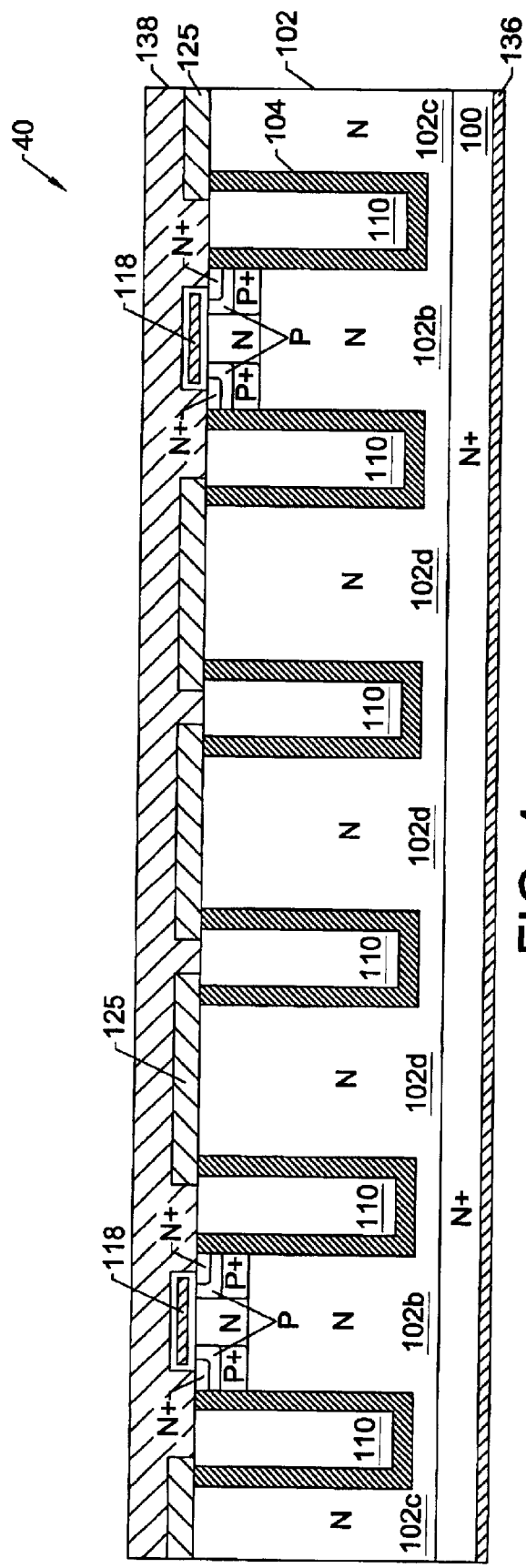
FIG. 4 is a cross-sectional view of a vertical power device according to a fourth embodiment of the present invention.
Figure 5:
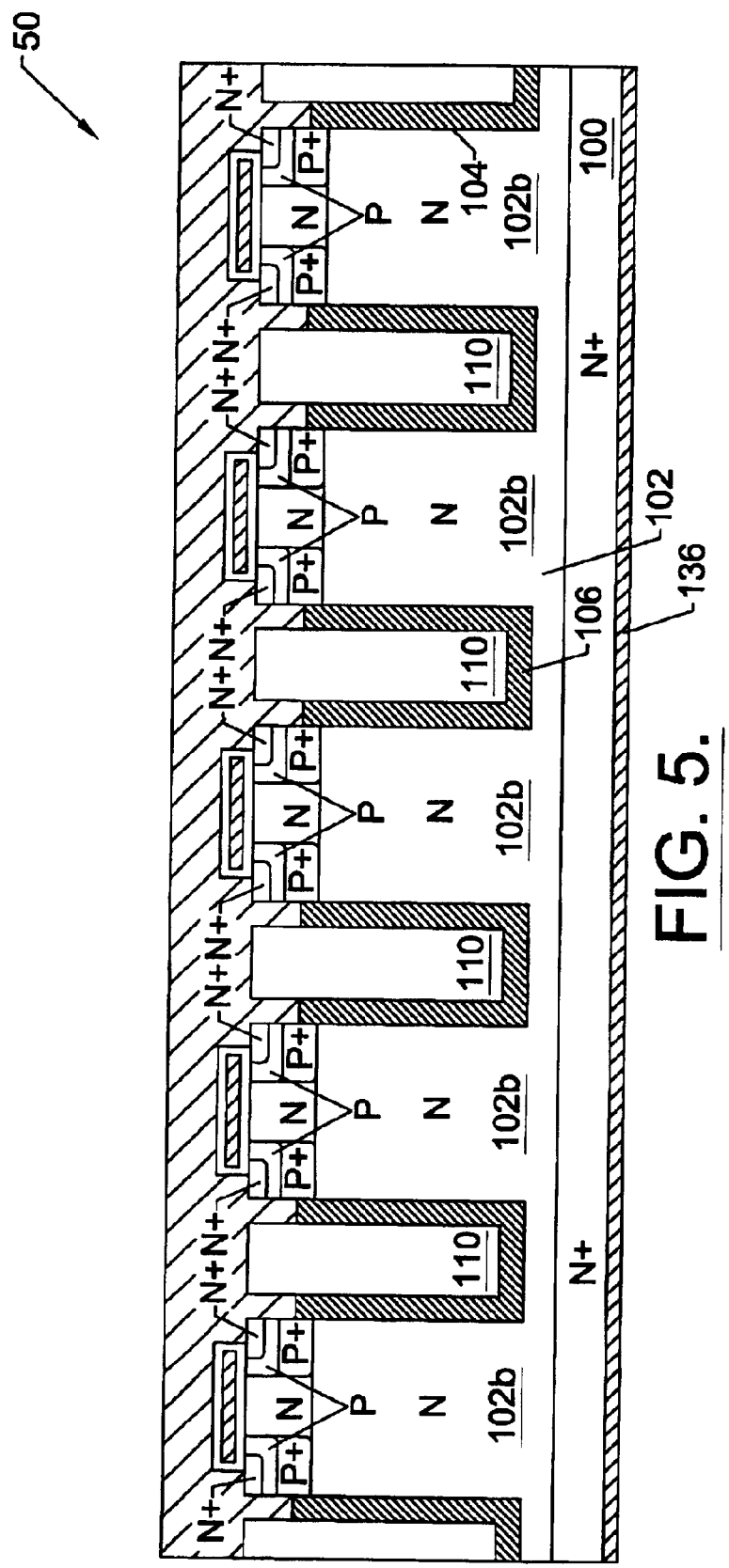
FIG. 5 is a cross-sectional view of a vertical power device according to a fifth embodiment of the present invention.

The multi-celled power device 40 of FIG. 4 is similar to the device 30 of FIG. 3, however, the dummy drift region mesas 102d (which may not contribute to forward on-state conduction, but preferably support equivalent reverse breakdown voltages) are capacitively coupled through a field plate insulating layer 125 to the source electrode 138. In contrast to the widths of the dummy drift region mesas 102d in FIG. 3, which should be equal to the widths of the drift region mesas 102b of the active unit cells, the widths of the dummy drift region mesas 102d in FIG. 4 need not be equal. The power device 50 of FIG. 5 is similar to the device 20 of FIG. 2, however, the electrically insulating layers 106 on the sidewalls of the trenches have been recessed to enable direct sidewall contact between the source electrode 138 and the source, base and shielding regions within the active unit cells. The establishment of this direct sidewall contact increases the active area of the device 50 by reducing and preferably eliminating the requirement that the source regions be periodically interrupted in a third dimension (not shown) in order to provide direct contacts to the base regions.

Figure 6:
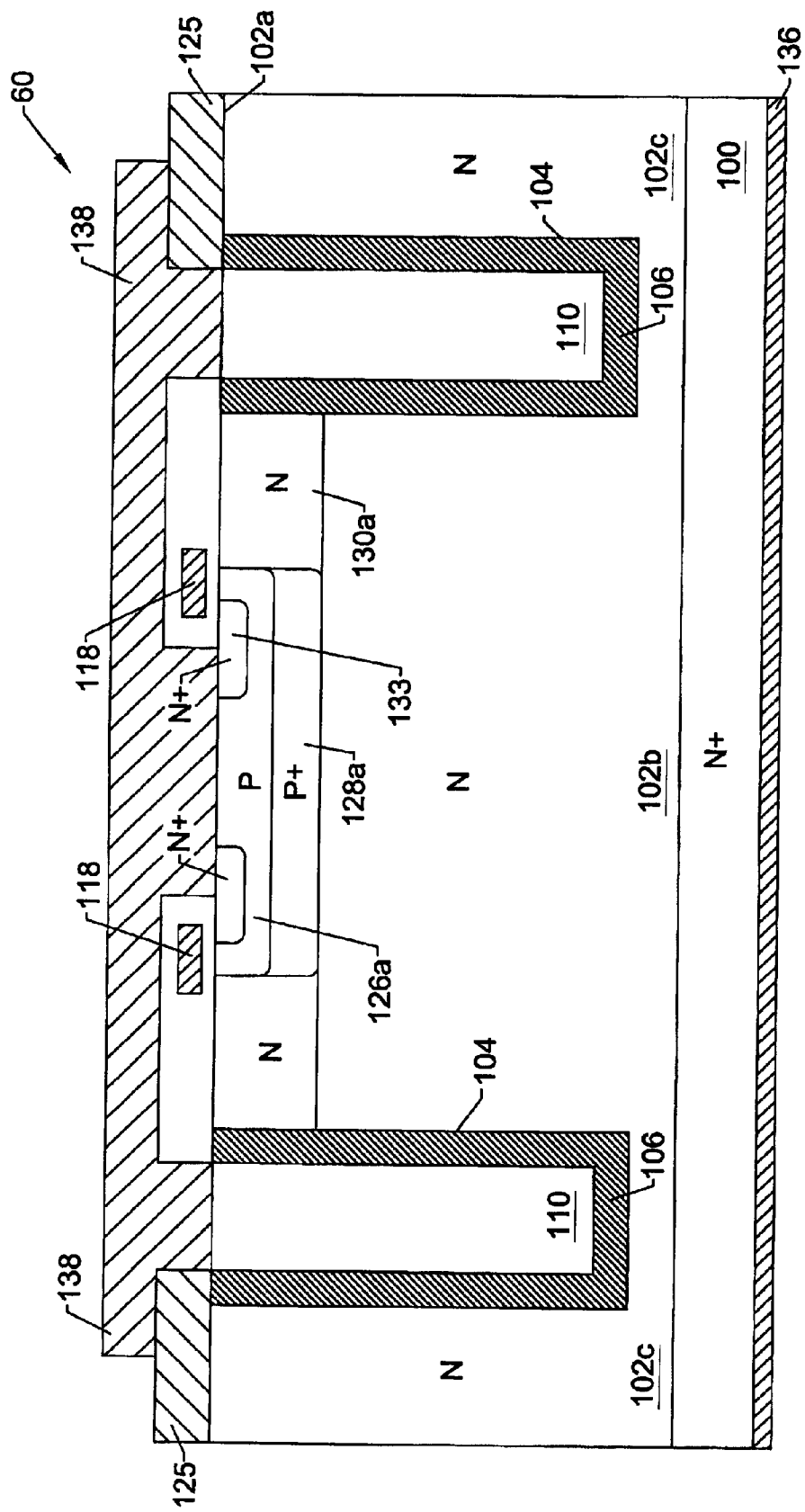
FIG. 6 is a cross-sectional view of a vertical power device according to a sixth embodiment of the present invention.
Figure 7:
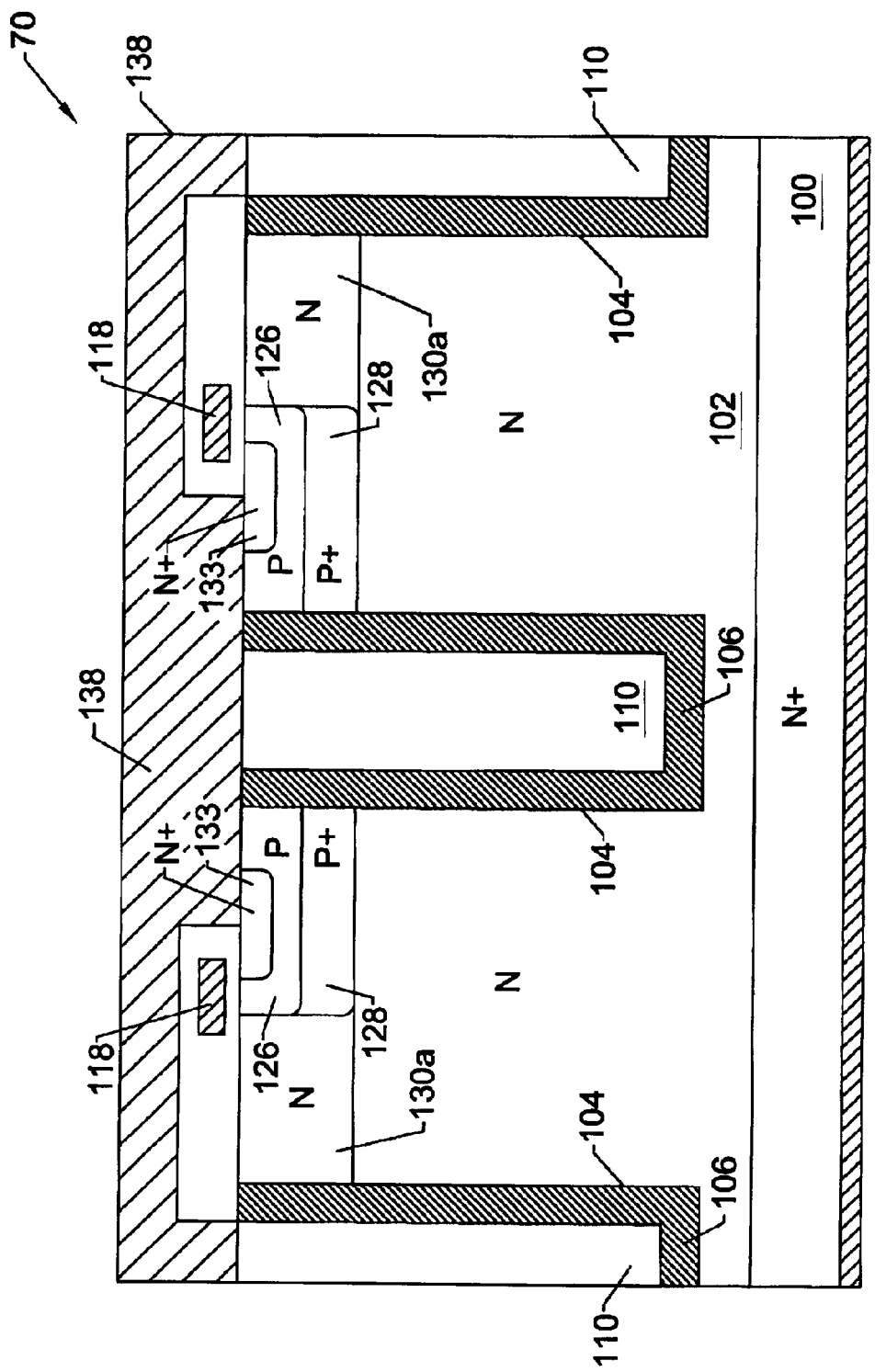
FIG. 7 is a cross-sectional view of a vertical power device according to a seventh embodiment of the present invention.
Figure 10:
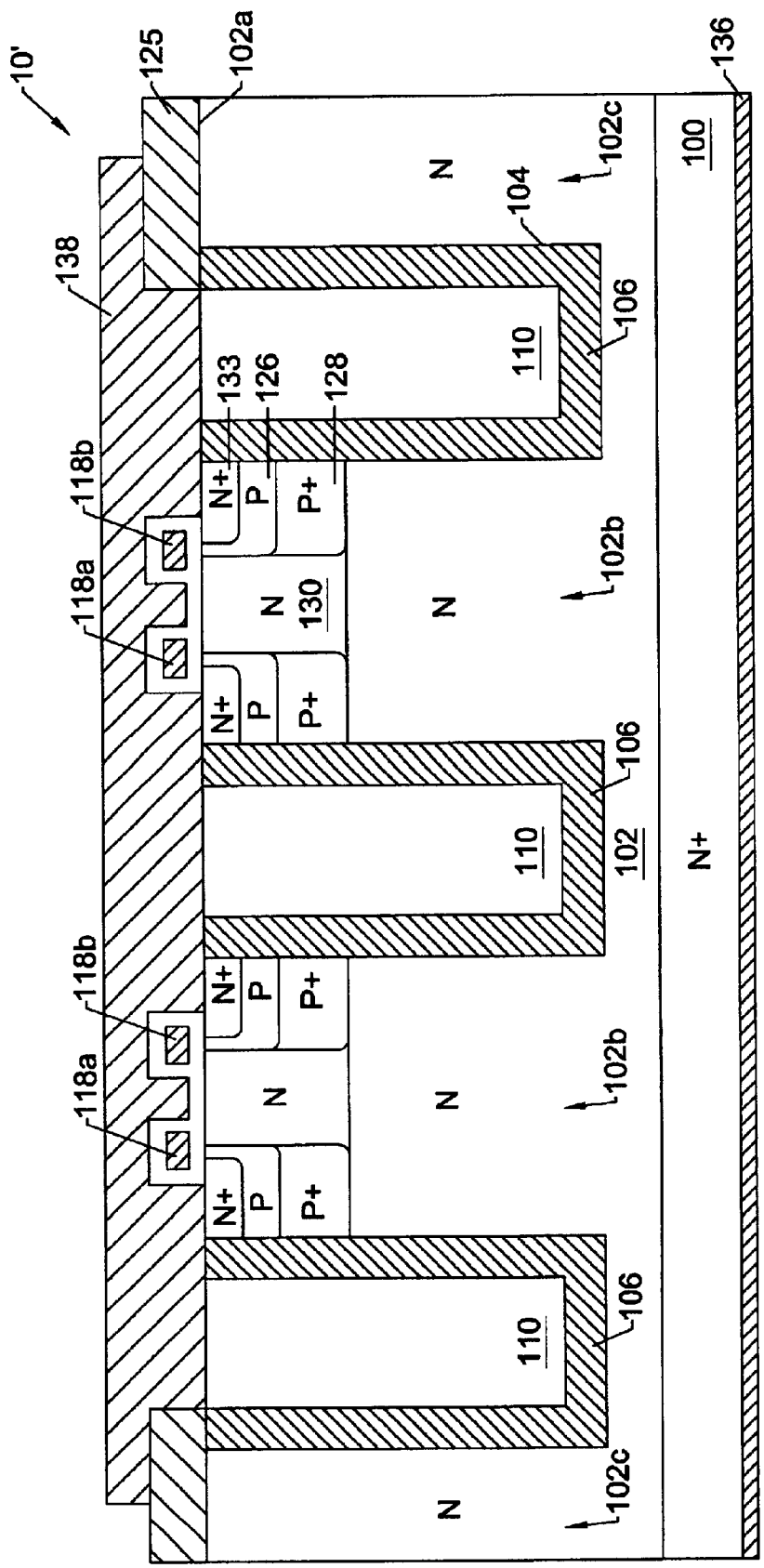
FIG. 10 is a cross-sectional view of a vertical power device according to another embodiment of the present invention.
Figure 11:
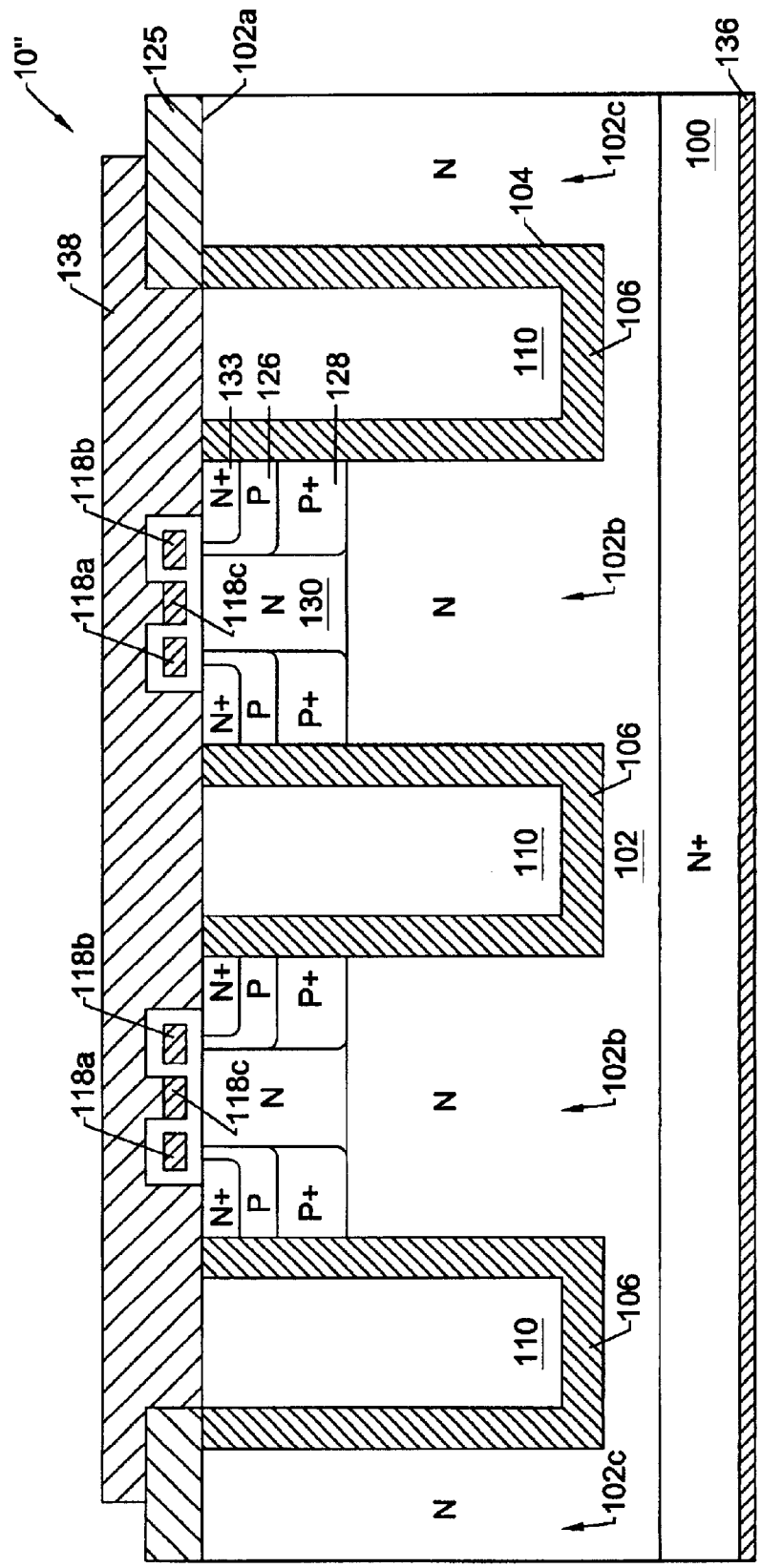
FIG. 11 is a cross-sectional view of a vertical power device that includes a dummy gate electrode electrically connected to a source electrode, according to another embodiment of the present invention.

The power device 60 of FIG. 6 illustrates a relatively wide active drift region mesa 102b with a centrally located base region 126a and shielding region 128a. The transition region 130a may have the same characteristics as described above with respect to the transition regions 130 within the power devices 10–50 of FIGS. 1–5. The power device 70 of FIG. 7 is similar to the device 60 of FIG. 6, however, the centrally located base region 126a and shielding region 128a of FIG. 6 have been separated by a centrally located trench 104. The power device 10' of FIG. 10 is similar to the power device 10 of FIG. 1, however, the insulated gate electrode 118 on each active mesa 102b has been replaced by a pair of shorter insulated gate electrodes 118a and 118b. For a mesa having a width of 2.6 microns, the gate electrodes 118a and 118b may have a length of 0.3 microns, for example. The use of a pair of shorter gate electrodes instead of a single continuous gate electrode that extends opposite the entire width of the transition region 130 can reduce the gate-to-drain capacitance $C_{gd}$ of the device 10' and increase high frequency power gain. The source electrode 138 also extends into the space between the gate electrodes 118a and 118b, as illustrated by FIG. 10. The portion of the source electrode 138 that extends into the space between the gate electrodes 118a and 118b may have a length of about 0.2 microns. The insulator that extends directly between the source electrode 138 and the transition region 130 may be a gate oxide and may have a thickness in a range between about 100 Å and about 1000 Å. The sidewall insulator that extends between the sidewalls of the gate electrodes 118a and 118b and the source electrode 138 may also have a thickness in a range between about 1000 Å and about 5000 Å, however, other sidewall insulator thicknesses may also be used. According to another aspect of this embodiment, the portion of the source electrode 138 that extends into the space between the gate electrodes 118a and 118b may be formed by patterning a conductive layer (e.g., polysilicon) used to form the gate electrode 118a and 118b. In particular, a third "dummy" gate electrode 118c may be patterned that extends opposite the transition region 130. An illustration of a vertical power device 10" that utilizes a dummy gate electrode 118c is provided by FIG. 11. The device 10" of FIG. 11 may otherwise be similar to the device 10' of FIG. 10. Electrical contact between this third dummy gate electrode 118c and the source electrode 138 may be made using conventional back-end processing techniques.

Figure 9A:
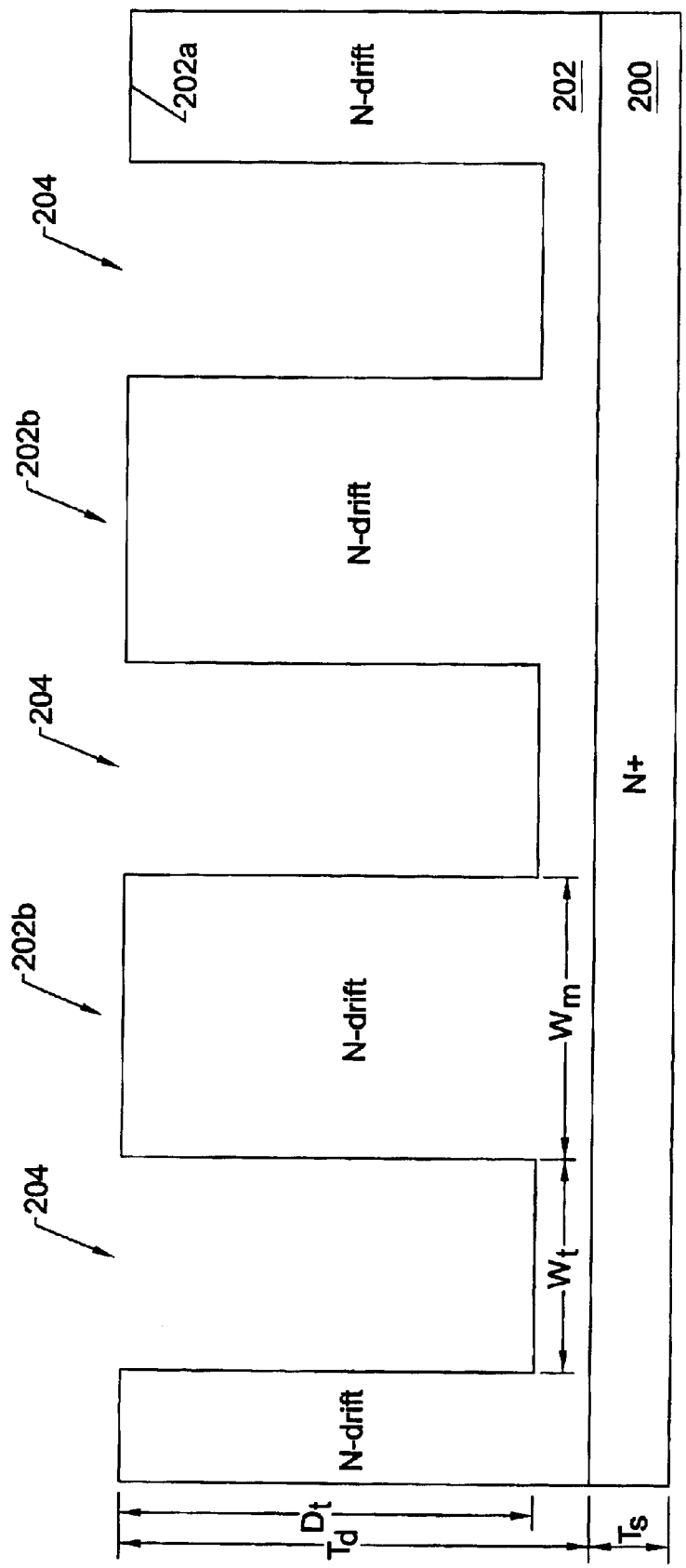
FIGS. 9A–9K are cross-sectional views of intermediate structures that illustrate preferred methods of forming the vertical power device of FIG. 5.

Preferred methods of forming the vertical power device of FIG. 5 with a 65 Volt product rating will now be described. As illustrated by FIG. 9A, these methods may include the step of epitaxially growing a drift region 202 of first conductivity type (shown as N) on a highly doped silicon substrate 200 (e.g., N+ substrate). This highly doped substrate 200 may have a first conductivity type doping concentration therein of greater than about $1 \times 10^{19}$ cm$^{-3}$ and may have an initial thickness $T_s$ of about 500 microns. The epitaxial growth step is preferably performed while simultaneously doping the drift region 202 with first conductivity type dopants in a graded manner. To achieve a 65 Volt product rating, a vertical power device having an actual blocking voltage of 75 Volts may be required. To achieve this blocking voltage, trenches having a depth in a range between about 4.5–5 microns will typically be required. To support trenches with this depth, a graded doped drift region 202 having a thickness $T_d$ of about 6 microns may be required. Preferably, a drift region 202 having a thickness of 6 microns will include a uniformly doped region at an upper surface thereof. This uniformly doped region may have a thickness in a range between about 0.5 and 1.0 microns and may be doped at a uniform level of about $1 \times 10^{16}$ cm$^{-3}$. The grade-doped portion of the drift region 202 may have a thickness of 5.0–5.5 microns and may be graded from a doping level of $1 \times 10^{16}$ cm$^{-3}$ at a depth of 0.5 or 1.0 microns, for example, to a higher level of at least about $5 \times 10^{16}$ cm$^{-3}$ at a depth of 6.0 microns. The drift region 202 may form an abrupt non-rectifying junction with the substrate 200.

Figure 9B:
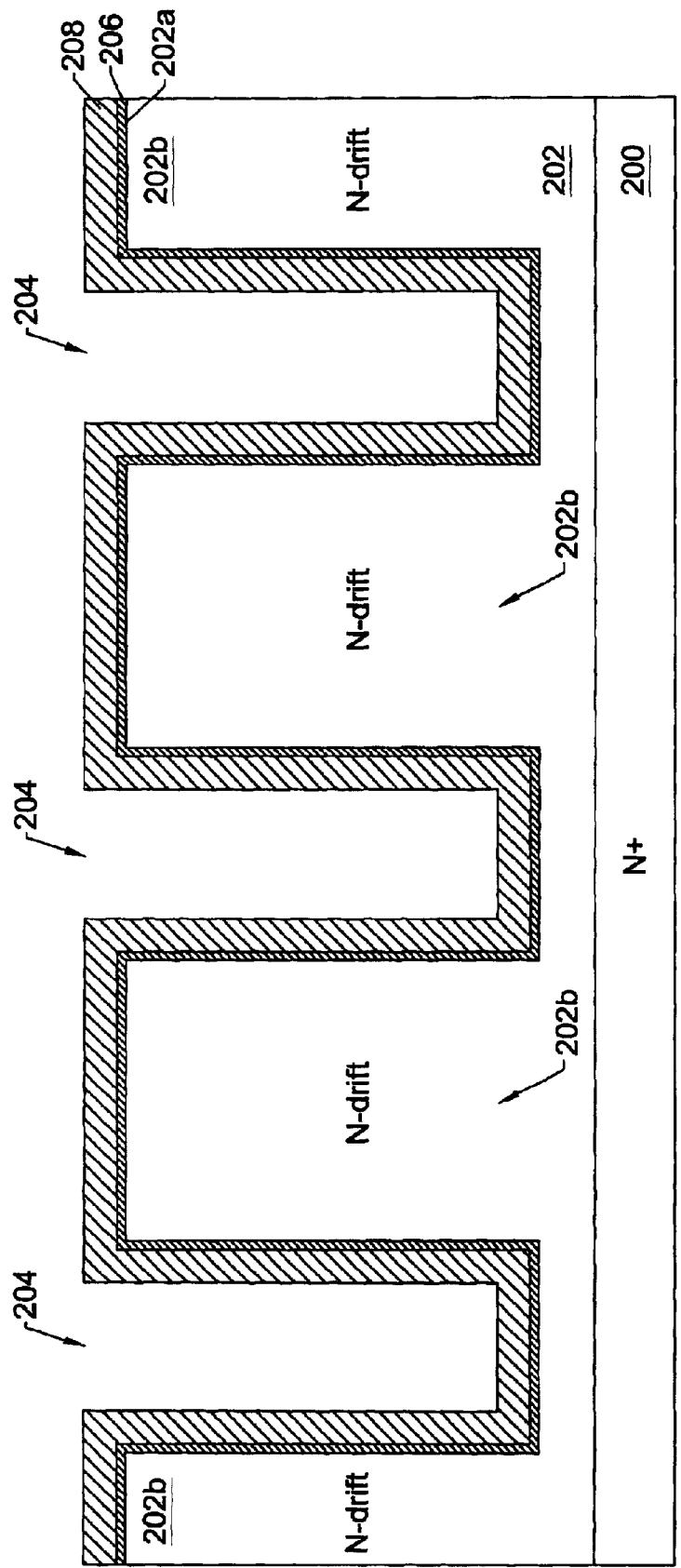

Conventional selective etching techniques may then be performed using a first etching mask (not shown) to define a plurality of parallel stripe-shaped trenches 204 in the drift region 202. Trenches 204 having other shapes may also be used. For example, each pair of adjacent trenches 204 may represent opposing sides of a respective ring-shaped trench. These trenches 204 may have a depth $D_t$ of 5 microns, for example. Adjacent trenches 204 define drift region mesas 202b therebetween, with the width $W_m$ of each mesa 202b controlled by the spacing between the adjacent trenches 204. As illustrated by FIG. 9B, a thin thermal oxide layer 206 may then be grown at a low temperature on the sidewalls and bottoms of the trenches 204 and on an upper surface 202a of each of the mesas 202b. For example, this thin oxide layer 206 may be grown for a duration of 30 minutes at a temperature of 900° C. in a wet $O_2$ ambient. This thermal growth step may result in an oxide layer 206 having a thickness of about 700 Å. This thin oxide layer 206 can be used to improve the interface between the sidewalls of the trenches 204 and subsequently formed regions within the trenches 204, by removing etching related defects. The thermal budget associated with this thermal oxide growth step should be insufficient to significantly alter the graded doping profile in the drift region 202, however, the doping concentration at the surface 202a of each mesa 202b may increase as a result of dopant segregation. A thick conformal oxide layer 208 may then be deposited at a low temperature to produce an electrically insulating spacer on the sidewalls and bottoms of the trenches 204. For a 65 Volt product rating, the total oxide thickness (thermal oxide plus deposited oxide) may be 3000 Å.

Figure 9C:
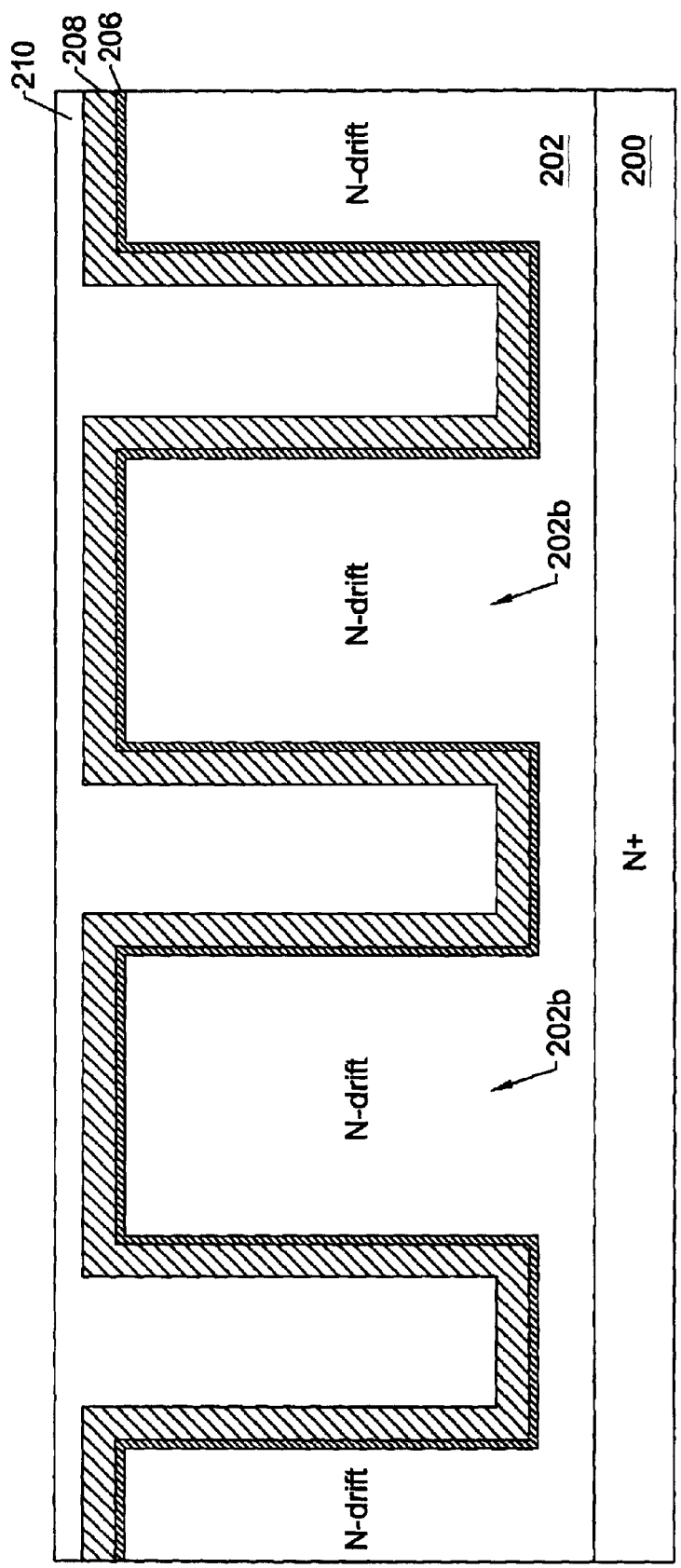
Figure 9D:
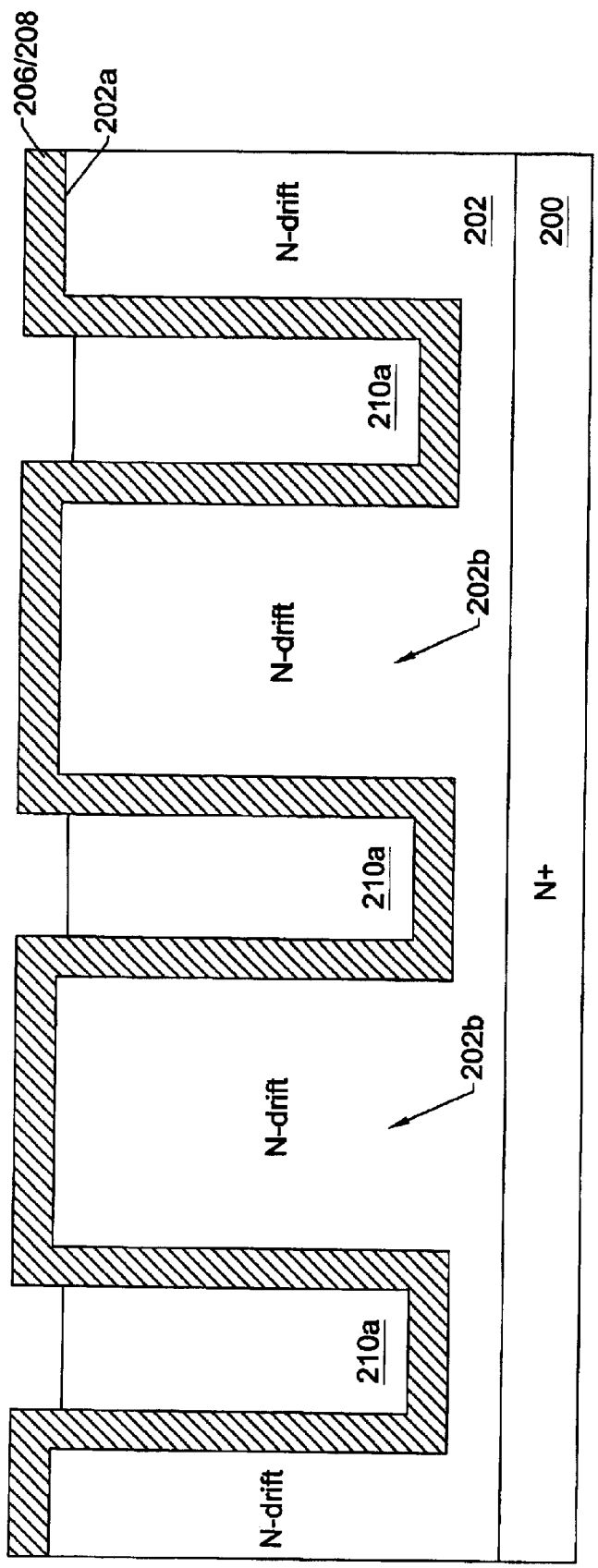
Figure 9E:
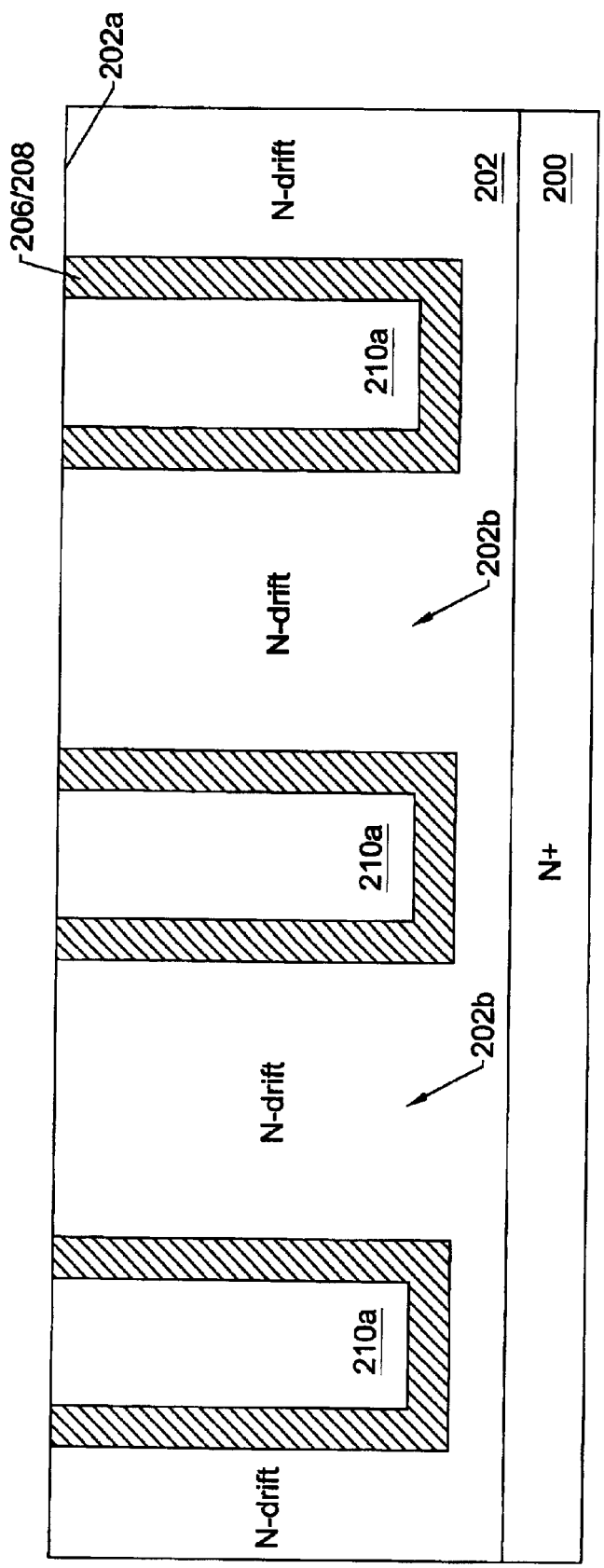

Referring now to FIG. 9C, a conformal polysilicon layer 210 may then be deposited using a low temperature CVD process. The thickness of this layer should be sufficient to fill the trenches 204. The polysilicon layer 210 may be in-situ doped (e.g., with phosphorus) so that a low sheet resistance of 10 ohms/square is achieved. As illustrated by FIG. 9D, the deposited polysilicon layer 210 may then be etched back using conventional etching techniques. The duration of this etching step may be sufficiently long that the polysilicon regions 210a within each trench 204 are planar with the upper surfaces 202a of the mesas 202b. This etch back step may be performed without an etching mask. Referring now to FIG. 9E, another etching step may then be performed with a second mask (not shown) in order to selectively remove the oxide over the mesas 202b, but preserve the oxide within field oxide regions (not shown) that may be located around a periphery of the drift region 202. This second mask may comprise a photoresist layer that has been patterned to define an etching window that is within a border of an outside trench (not shown) that surrounds an integrated power device containing a plurality of the illustrated power devices as unit cells.

Figure 9F:
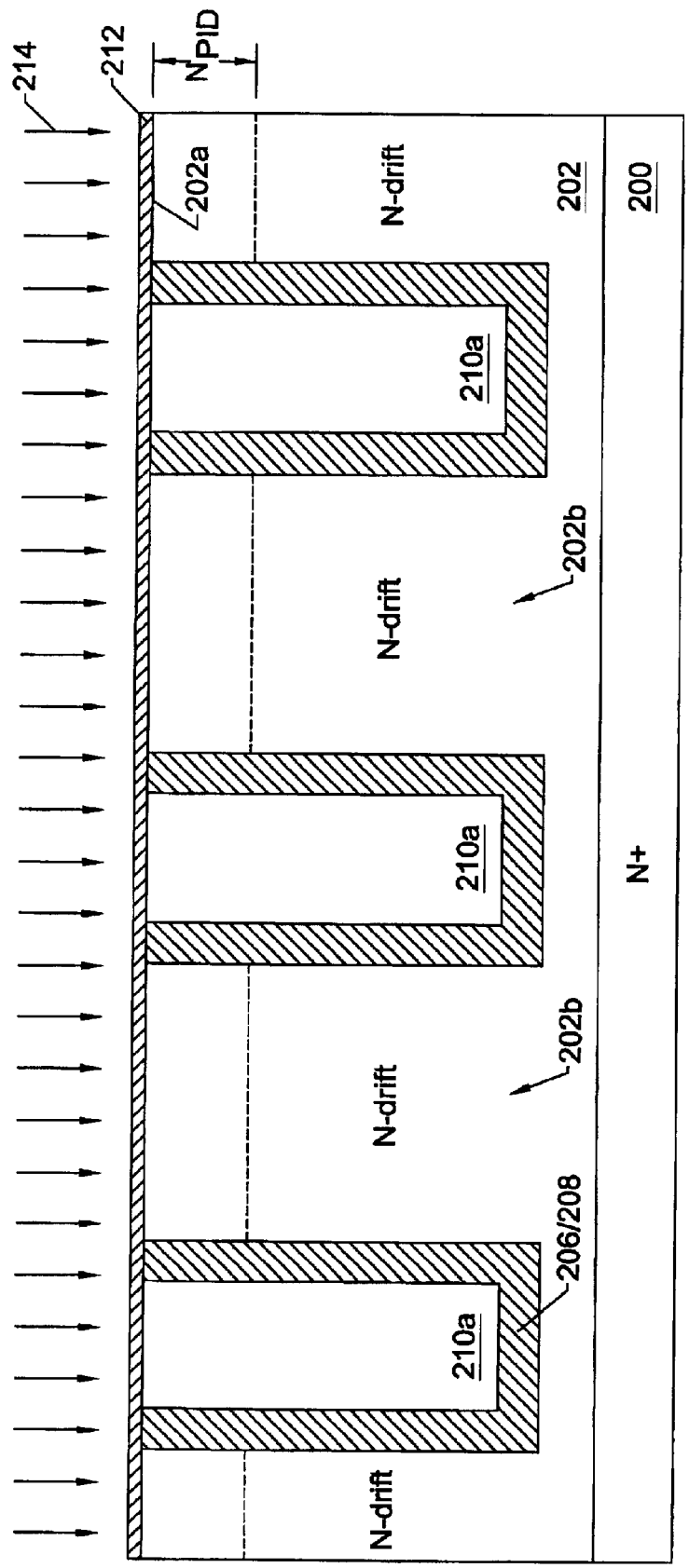

As Illustrated by FIG. 9F, a thin pad oxide layer 212 is then grown as a screening oxide over the exposed upper surfaces of the mesas 202b. This thin pad oxide layer 212 may have a thickness of about 250 Å. This thin pad oxide layer 212 may be grown for a duration of 10 minutes at a temperature of 900° C. in a wet $O_2$ ambient. Transition region dopants 214 of first conductivity type may then be implanted using a blanket implant step. In particular, transition regions having vertically retrograded doping profiles therein relative to the upper surface 202a may be formed by implanting phosphorus dopants at an energy level of 200 keV and at a preferred dose level of $5 \times 10^{12}$ cm$^{-2}$. This energy level of 200 keV and dose level of $5 \times 10^{12}$ cm$^{-2}$ may result in an N-type transition region having a peak Implant depth ($N_{PID}$) of about 0.25–0.3 microns and a peak dopant concentration of about $1.3 \times 10^{17}$ cm$^{-3}$. As illustrated on the left side of FIG. 8A, the N-type dopant concentration in the N-type transition region may be set to a value of less than about $2 \times 10^{16}$ cm$^{-3}$ at the upper surface 202a.

Figure 9G:
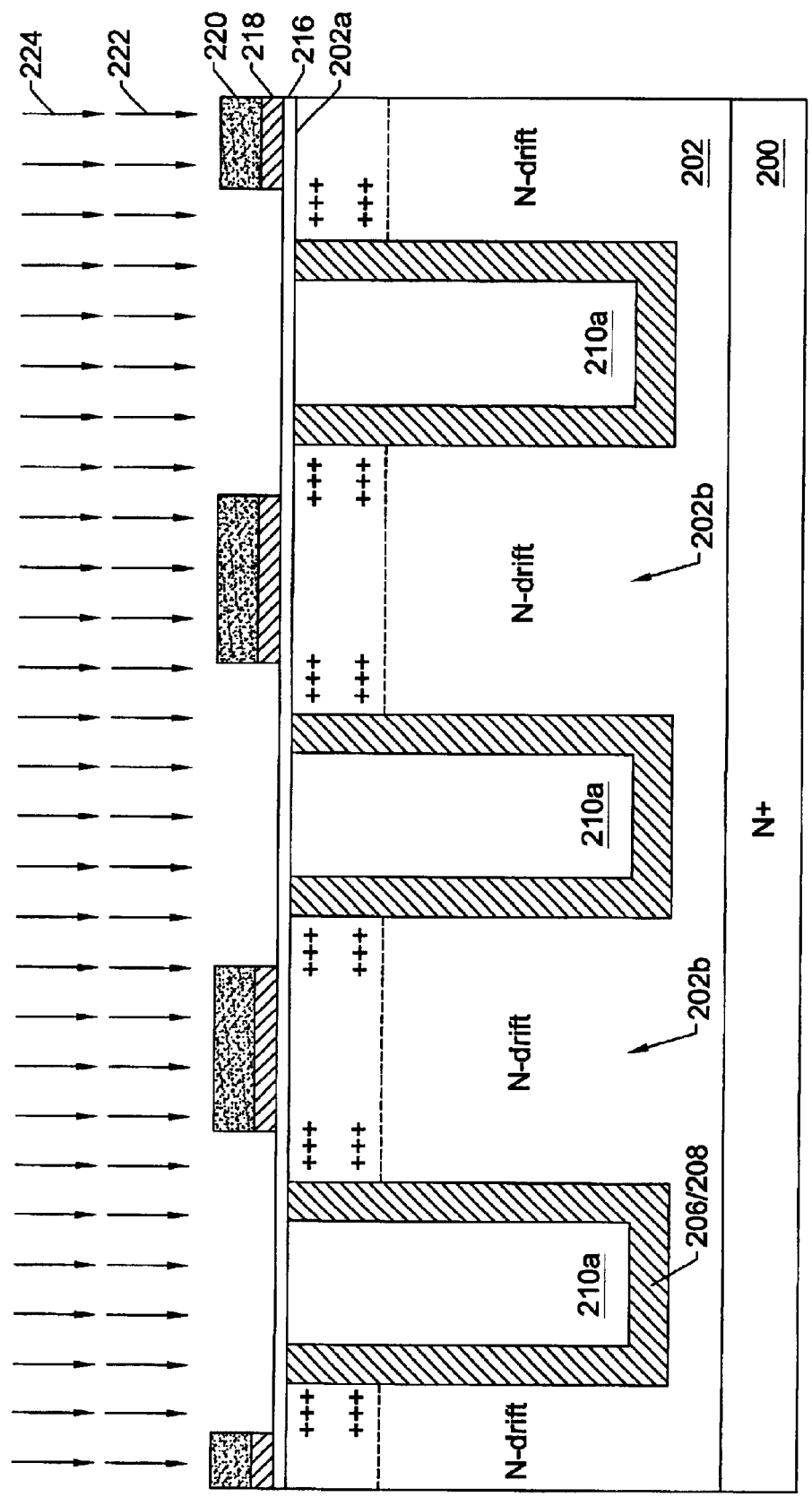

Referring now to FIG. 9G, the pad oxide layer 212 is then removed and in its place a gate oxide layer 216 having thickness of about 500 Å may be formed. This gate oxide layer 216 may be provided by performing a thermal oxidation step in a wet $O_2$ ambient for a duration of 20 minutes and at a temperature of 900° C. A blanket polysilicon layer 218 is then deposited and patterned using a photoresist mask layer 220 (third mask), to define a plurality of gate electrodes 218. A sequence of self-aligned implant steps are then performed. In particular, highly doped self-aligned shielding regions of second conductivity may be formed in the transition region by implanting shielding region dopants 222 (e.g., boron) at an energy level of 100 keV and at a dose level of $1 \times 10^{14}$ cm$^{-2}$. After thermal treatment, these energy and dose levels may ultimately result in a shielding region having a peak boron concentration of about $5 \times 10^{18}$ cm$^{-3}$ at a depth of about 0.3 microns, assuming a characteristic diffusion length of about 0.1 microns. These shielding region dopants 222 are preferably implanted using both the gate electrodes 218 and the mask layer 220 as an implant mask. Self-aligned base regions of second conductivity type may also be formed in the shielding regions by implanting base region dopants 224 (e.g., boron) at an energy level of 50 keV and at a dose level of $3 \times 10$ cm$^{-2}$. The locations of peak concentrations of the shielding region dopants 222 and base region dopants 224 within the mesas 202b, are represented by the reference characters "+". The peak concentration of the shielding region dopants may equal $3 \times 10^{18}$ cm$^{-3}$, at a depth of 0.25–0.3 microns. This depth preferably matches the depth of the peak of the transition region dopants.

Figure 9H:
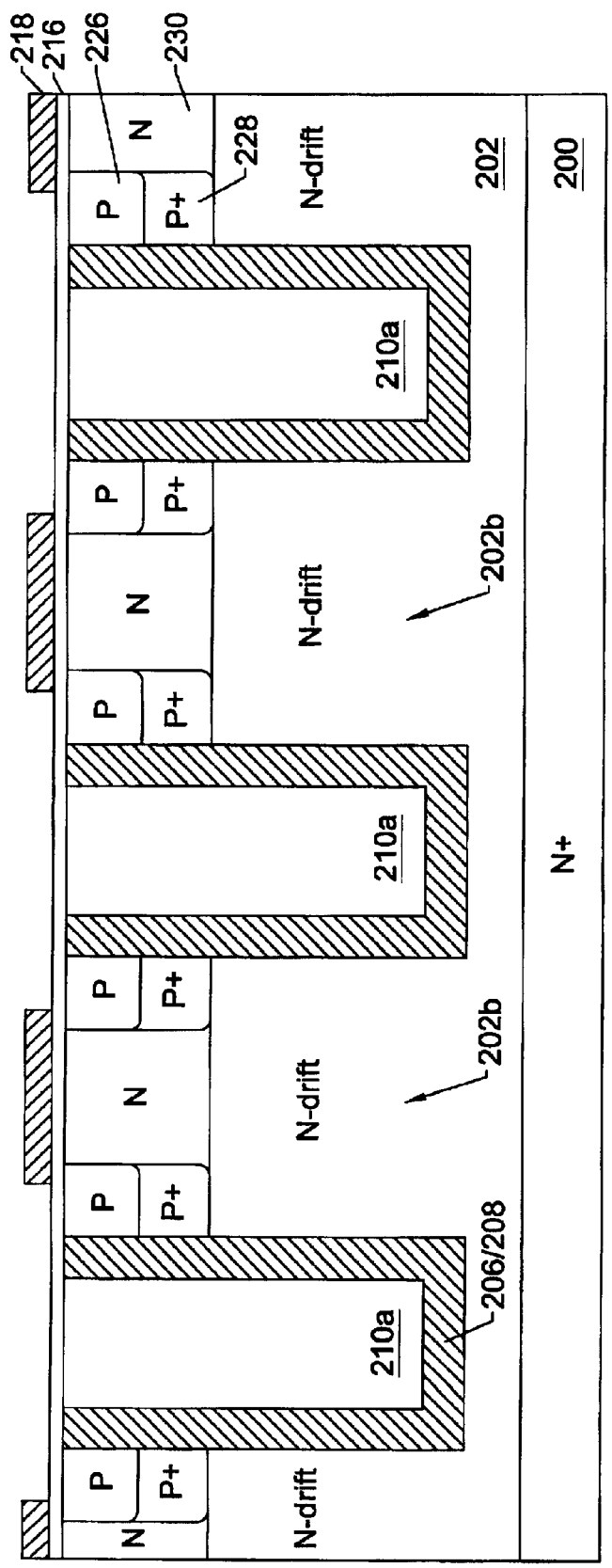

Referring now to FIG. 9H, the mask layer 220 may be removed and then a drive-in step may be performed at a temperature of about 1000° C. and for a duration of about 60 minutes to define self-aligned base regions 226 (shown as P), self-aligned shielding regions 228 (shown as P+) and the transition regions 230 (shown as N). This drive-in step, which causes lateral and downward diffusion of the implanted base, shielding and transition region dopants, may provide the highest thermal cycle in the herein described method. If the uniform and graded doping profile in the drift region is significantly altered during this step, then the initial drift region doping profile may be adjusted to account for the thermal cycle associated with the drive-in step. As illustrated by FIG. 9H, the implant energies and duration and temperature of the drive-in step may be chosen so that the depth of the P-N junction between the P+ shielding region 228 and the drift region 202 is about equal to the depth of the non-rectifying junction between the transition region 230 and the drift region 202, however, unequal depths may also be used. The depth of the P-N junction may equal 0.7 microns.

Figure 9I:
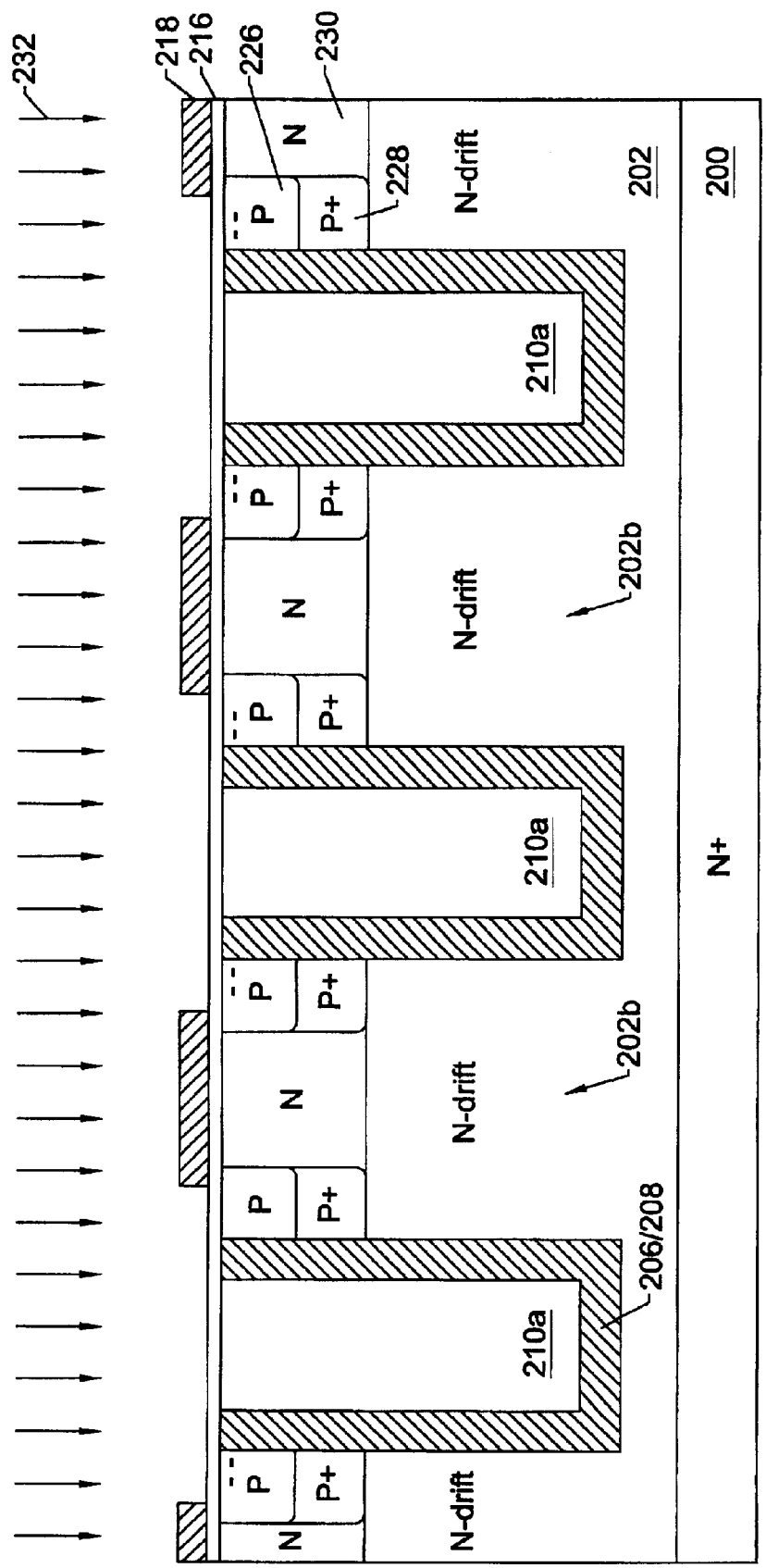
Figure 9J:
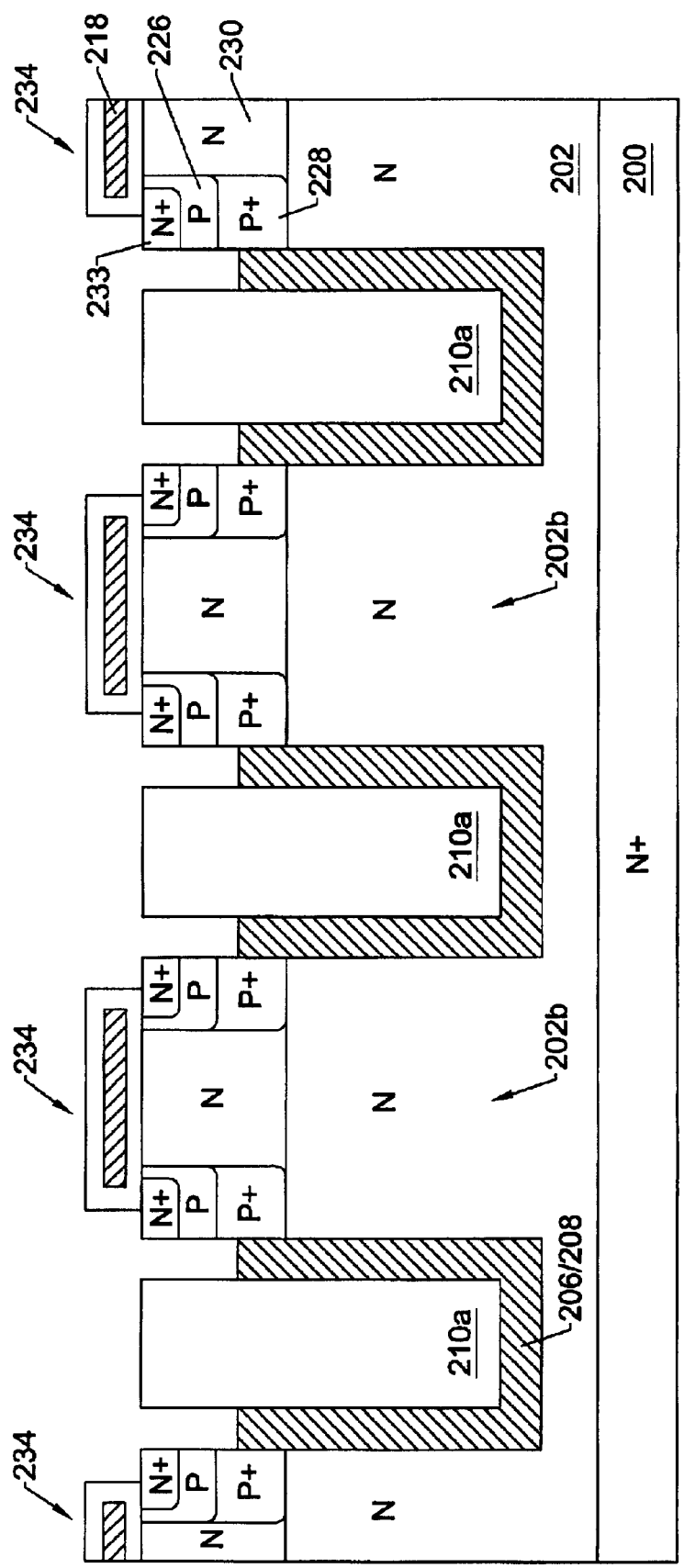
Figure 9K:
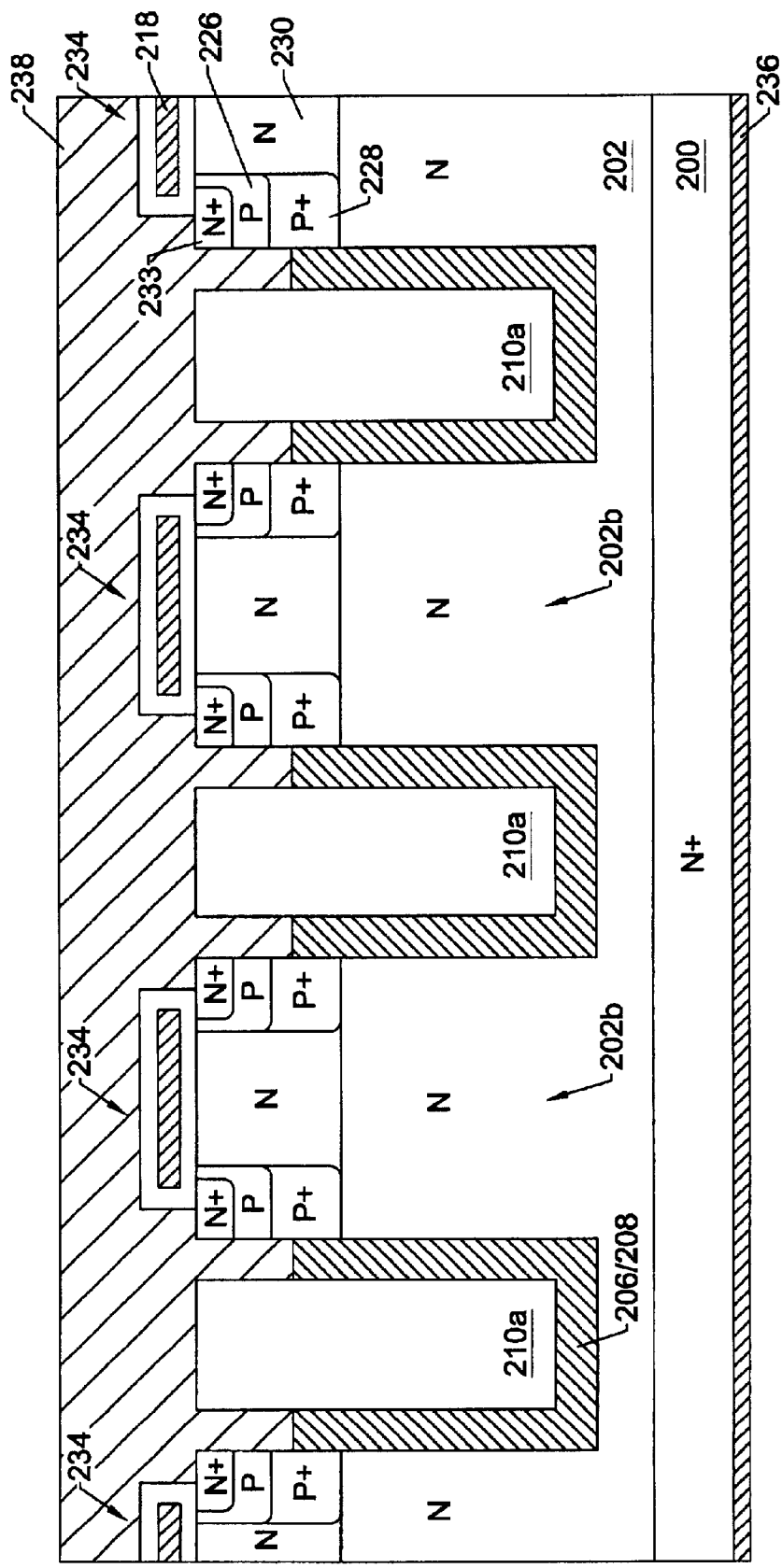

Referring now to FIG. 9I, source region dopants 232 of first conductivity type are then implanted into the base regions 226, using the gate electrodes 218 as an implant mask. The source region dopants 232 may be implanted at an energy level of 40 keV and at a dose level of $2 \times 10^{14}$ cm$^{-2}$. As illustrated by FIG. 9J, the implanted source region dopants (shown by reference character "–") may then be driven-in at a temperature of 900° C. and for a duration of 10 minutes, to define N+ source regions 233. This implant step may be performed using the gate electrodes 218 and fourth photoresist mask (not shown) as an implant mask. The fourth photoresist mask may be patterned to define the locations of shorts to the P-base region in a third dimension relative to the illustrated cross-section (not shown). Conventional insulator deposition, sidewall spacer formation and patterning steps may then be performed to define a plurality of insulated gate electrodes 234. These steps may also be performed to define contact windows to the source regions, the P-base regions, the polysilicon in the trenches and the gate electrodes. The insulating regions 206/208 lining upper sidewalls of the trenches may also be selectively etched back to expose sidewalls of the source, base and shielding regions. The presence of this etch back step may eliminate the need to define shorts to the P-base region, using the fourth photoresist mask, and therefore may result in an increase in the forward on-state conduction area for a given lateral unit cell dimension. As illustrated by FIG. 9K, conventional front side metallization deposition and patterning steps may also be performed to define a source contact 238 and gate contact (not shown). As illustrated, the source contact 238 extends along the upper sidewalls of the trenches 204 and contacts the exposed portions of the source, base and shielding regions. The backside of the substrate 200 may also be thinned and then conventional backside metallization steps may be performed to define a drain contact 236.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A vertical power device, comprising:
    a semiconductor substrate having first and second trenches and a drift region of first conductivity type therein that extends into a mesa defined by the first and second trenches;
    first and second insulated electrodes in the first and second trenches;
    first and second base regions of second conductivity type that extend adjacent sidewalls of the first and second trenches, respectively, and in the mesa;
    first and second source regions of first conductivity type in said first and second base regions, respectively;
    an insulated gate electrode that extends on a surface of said semiconductor substrate and opposite said first base region; and
    a transition region of first conductivity type that extends between said first and second base regions, forms a non-rectifying junction with the drift region and has a vertically retrograded first conductivity type doping profile relative to the surface.

2. The device of claim 1, wherein a peak first conductivity type dopant concentration in said transition region is at least ten times greater than a value of the retrograded first conductivity type doping profile at the surface.

3. The device of claim 1, wherein said first and second insulated electrodes are electrically connected to said first and second source regions.

4. The device of claim 3, wherein said first insulated electrode ohmically contacts said first base region and said first source region at the sidewall of the first trench.

5. The device of claim 1, wherein said transition region has a peak first conductivity type dopant concentration therein at a first depth relative to the surface; and wherein a product of the peak first conductivity type dopant concentration in said transition region and a width of said transition region at the first depth is in a range between $1 \times 10^{12}$ cm$^{-2}$ and $7 \times 10^{12}$ cm$^{-2}$.

6. The device of claim 5, wherein the peak first conductivity type dopant concentration in said transition region is greater than about $1 \times 10^{17}$ cm$^{-3}$; wherein the surface defines an interface between said insulated gate electrode and said transition region; and wherein a first conductivity type dopant concentration in said transition region is less than about $2 \times 10^{16}$ cm$^{-3}$ at the surface.

7. The device of claim 1, wherein said transition region has a peak first conductivity type dopant concentration therein at a first depth relative to the surface; and wherein a product of the peak first conductivity type dopant concentration in said transition region and a width of said transition region at the first depth is in a range between $3.5 \times 10^{12}$ cm$^{-2}$ and $6.5 \times 10^{12}$ cm$^{-2}$.

8. The device of claim 1, wherein said transition region has a peak first conductivity type dopant concentration therein at a first depth relative to the surface; and wherein a product of the peak first conductivity type dopant concentration in said transition region and a width of the non-rectifying junction is in a range between $1 \times 10_{12}$ cm$^{-2}$ and $7 \times 10^{12}$ cm$^{-2}$.

9. The device of claim 1, wherein said transition region has a peak first conductivity type dopant concentration therein at a first depth relative to the surface; and wherein a product of the peak first conductivity type dopant concentration in said transition region, a width of said transition region at the first depth and a width of the mesa is less than $2 \times 10^{15}$ cm$^{-1}$.

10. The device of claim 1, wherein said first source region and said first base region are self-aligned to said insulated gate electrode.

11. The device of claim 1, further comprising:
a first shielding region of second conductivity type that extends between said first base region and the drift region and is more highly doped than said first base region; and
a second shielding region of second conductivity type that extends between said second base region and the drift region and is more highly doped than said second base region.

12. The device of claim 11, wherein said first and second shielding regions form respective P-N rectifying junctions with said transition region; wherein said transition region has a peak first conductivity type dopant concentration therein at a first depth relative to the surface; and wherein a product of the peak first conductivity type dopant concentration in said transition region and a width between said first and second shielding regions is in a range between $1 \times 10^{12}$ cm$^{-2}$ and $7 \times 10^{12}$ c$^{-2}$.

13. The device of claim 11, wherein the non-rectifying junction extends between said first and second shielding regions.

14. The device of claim 1, wherein the drift region has a vertically retrograded first conductivity type doping profile therein relative to the surface.

15. The device of claim 1, wherein said insulated gate electrode extends opposite said first and second source regions, said first and second base regions and said transition region.

16. The device of claim 1, further comprising a third trench in said semiconductor substrate, said second and third trenches defining a dummy mesa therebetween into which the drift region extends.

17. The device of claim 16, further comprising a third base region of second conductivity type that extends in the dummy mesa and is electrically connected to said first and second source regions.

18. The device of claim 17, wherein a width of the dummy mesa extending between said second and third trenches equals a with of the mesa extending between said first and second trenches.

19. The device of claim 16, further comprising:
a third insulated electrode in said third trench;
a field plate insulating layer on the dummy mesa; and
a source electrode that extends on said field plate insulating layer and is electrically connected to said first, second and third insulated electrodes.

20. The device of claim 19, wherein a spacing between said first and second trenches is unequal to the spacing between said second and third trenches.

21. A vertical power device, comprising:
a semiconductor substrate having first and second trenches and a drift region of first conductivity type therein that extends into a mesa defined by the first and second trenches;
first and second insulated electrodes in the first and second trenches;
first and second base regions of second conductivity type that extend adjacent sidewalls of the first and second trenches, respectively, and in the mesa;
first and second source regions of first conductivity type in said first and second base regions, respectively;
an insulated gate electrode that extends on a surface of said semiconductor substrate and opposite said first base region; and
a transition region of first conductivity type that extends between said first and second base regions and forms a non-rectifying junction with the drift region, said transition region having a peak first conductivity type dopant concentration therein at a first depth relative to a surface of said substrate; and wherein a product of the peak first conductivity type dopant concentration in said transition region and a width of said transition region at the first depth is in a range between $3.5 \times 10^{12}$ cm$^{-2}$ and $6.5 \times 10^{12}$ cm$^{-2}$.

22. The vertical power device of claim 21, wherein a product of a width of the mesa and a quantity of first conductivity type charge in a portion of the mesa extending below the transition region is preferably in a range between $2 \times 10^9$ cm$^{-1}$ and $2 \times 10^{10}$ cm$^{-1}$.

23. The vertical power device of claim 21, further comprising third and fourth trenches in said semiconductor substrate, said second and third trenches defining a first dummy mesa therebetween into which the drift region extends and said third and fourth trenches defining a second dummy mesa therebetween into which th drift region extends.

* * * * *

UNITED STATES PATENT AND TRADEMARK OFFICE
CERTIFICATE OF CORRECTION

PATENT NO. : 6,781,194 B2
DATED : August 24, 2004
INVENTOR(S) : Bantval Jayant Baliga It is certified that error appears in the above-identified patent and that said Letters Patent is hereby corrected as shown below:

Column 17,
Line 61, change "$7X10^{12} \ c^{-2}$" to -- $7X10^{12} \ cm^{-2}$ --.

Signed and Sealed this

Twenty-first Day of December, 2004

JON W. DUDAS
*Director of the United States Patent and Trademark Office*